(12) United States Patent
Chang et al.

(10) Patent No.: US 12,380,956 B2
(45) Date of Patent: Aug. 5, 2025

(54) MULTI-STATE ONE-TIME PROGRAMMABLE MEMORY CIRCUIT

(71) Applicant: Jmem Technology Co., Ltd., Taipei (TW)

(72) Inventors: Chen-Feng Chang, Taoyuan (TW); Yu-Chen Lo, Taipei (TW); Tsung-Han Lu, New Taipei (TW); Shu-Chieh Chang, Taoyuan (TW); Chun-Hao Liang, New Taipei (TW); Dong-Yu Wu, Taipei (TW); Meng-Lin Wu, Taoyuan (TW)

(73) Assignee: Jmem Technology Co., Ltd., Taipei (TW)

( * ) Notice: Subject to any disclaimer, the term of this patent is extended or adjusted under 35 U.S.C. 154(b) by 170 days.

(21) Appl. No.: 18/236,915

(22) Filed: Aug. 22, 2023

(65) Prior Publication Data

US 2024/0071538 A1     Feb. 29, 2024

Related U.S. Application Data

(60) Provisional application No. 63/370,690, filed on Oct. 20, 2022, provisional application No. 63/373,383, filed on Aug. 24, 2022.

(51) Int. Cl.
  *G11C 17/16* (2006.01)
  *G11C 17/18* (2006.01)

(52) U.S. Cl.
  CPC ............ *G11C 17/165* (2013.01); *G11C 17/18* (2013.01)

(58) Field of Classification Search
  CPC .............................. G11C 17/165; G11C 17/16

USPC ........................................................... 365/96
  See application file for complete search history.

(56) References Cited

U.S. PATENT DOCUMENTS

| | | | |
|---|---|---|---|
| 9,019,742 B2 * | 4/2015 | Chung | G11C 11/5692 365/158 |
| 9,613,714 B1 | 4/2017 | Wong et al. | |
| 2006/0054952 A1 | 3/2006 | Schoellkopf et al. | |
| 2009/0257265 A1 * | 10/2009 | Chen | H10N 70/8265 365/163 |
| 2012/0044733 A1 * | 2/2012 | Scheuerlein | G11C 17/165 257/E21.003 |
| 2013/0051113 A1 | 2/2013 | Kwon | |
| 2016/0148705 A1 | 5/2016 | Lee et al. | |
| 2022/0028444 A1 * | 1/2022 | Papageorgiou | G06N 3/08 |

FOREIGN PATENT DOCUMENTS

| | | |
|---|---|---|
| CN | 111933193 A | 11/2020 |
| CN | 113130497 A | 7/2021 |
| CN | 114695363 A | 7/2022 |

* cited by examiner

*Primary Examiner* — Muna A Techane
(74) *Attorney, Agent, or Firm* — ScienBiziP, P.C.

(57) ABSTRACT

The present disclosure provides a multi-state one-time programmable (MSOTP) memory circuit including a memory cell and a programming voltage driving circuit. The memory cell includes a MOS storage transistor, a first MOS access transistor and a second MOS access transistor electrically connected to store two bits of data. When the memory cell is in a writing state, the programming voltage driving circuit outputs a writing control potential to the gate of the MOS storage transistor, and when the memory cell is in a reading state, the programming voltage driving circuit outputs a reading control potential to the gate of the MOS storage transistor.

22 Claims, 12 Drawing Sheets

MULTI-STATE ONE-TIME PROGRAMMABLE MEMORY CIRCUIT

CROSS-REFERENCE TO RELATED APPLICATION(S)

This application claims the benefit of and priority to U.S. Provisional Patent Application No. 63/373,383 ('383 Provisional Application) filed on Aug. 24, 2022, and U.S. Provisional Patent Application No. 63/370,690 ('690 Provisional Application) filed on Oct. 20, 2022. The contents disclosed in the '383 and '690 Provisional Applications are hereby incorporated herein by reference in their entireties.

FIELD

The present disclosure relates to a one-time programmable memory, and more particularly, to a multi-state one-time programmable memory circuit.

BACKGROUND

Traditional one-time programmable (OTP) memory cells can only store one bit of data (1 or 0), so they are easily cracked by brute-force attacks. The recent growth and demand for higher levels of hardware security has prompted OTP memory cells to be embedded into system-on-chip (SoC) designs for more secure data storage. Non-volatile, low power consumption, low-area overhead, and uncrackable OTP memory cells are goals to meet design specifications. Accordingly, that present disclosure proposes a multi-state one-time programmable (MSOTP) memory circuit to solve the above-mentioned problems.

SUMMARY

In view of the above, the present disclosure provides a multi-state one-time programmable (MSOTP) memory circuit comprising: a first bit line and a second bit line, a first word line and a second word line, a memory cell and a programming voltage driving circuit. The memory cell includes a metal oxide semiconductor field effect (MOS) storage transistor having a gate, a first electrode and a second electrode, wherein a first non-breakdown state or a first breakdown state exists between the gate and the first electrode of MOS storage transistor, and a second non-breakdown state or a second breakdown state exists between the gate and the second electrode of MOS storage transistor; a first metal oxide semiconductor field effect (MOS) access transistor having a first gate, a first electrode and a second electrode, wherein the first gate is electrically connected to the first word line, the first electrode of the first MOS access transistor is electrically connected to the first bit line, and the second electrode of the first MOS access transistor is electrically connected to the first electrode of the MOS storage transistor; and a second metal oxide semiconductor field effect (MOS) access transistor having a second gate, a first electrode and a second electrode, wherein the second gate is electrically connected to the second word line, the first electrode of the second MOS access transistor is electrically connected to the second electrode of the MOS storage transistor, and the second electrode of the second MOS access transistor is electrically connected to the second bit line. The programming voltage driving circuit is electrically connected to the gate of the MOS storage transistor and configured to selectively output one of a writing control potential and a reading control potential. The programming voltage driving circuit outputs the writing control potential to the gate of the MOS storage transistor when the memory cell is in a first writing state. The programming voltage driving circuit outputs the reading control potential to the gate of the MOS storage transistor when the memory cell is in a reading state.

In one embodiment of the present disclosure, the programming voltage driving circuit further includes a charge pump circuit and a power switch. The charge pump circuit has a voltage input terminal and a voltage output terminal, and the voltage output terminal is electrically connected to the gate of the MOS storage transistor. The charge pump circuit is configured to receive a direct current (DC) voltage from the voltage input terminal, boost the DC voltage to generate the writing control potential, and output one of the writing control potential and the reading control potential to the gate of the MOS storage transistor via the voltage output terminal. The power switch is electrically connected to the voltage output terminal of the charge pump circuit and configured to receive a switching signal and control the charge pump circuit to output one of the writing control potential and the reading control potential to the gate of the MOS storage transistor according to the switching signal.

In one embodiment of the present disclosure, the MSOTP memory circuit further comprises a control circuit and a bit line decoding and precharging integration circuit. The control circuit is electrically connected to the first word line and the second word line and configured to output a first gate control signal to the first gate of the first MOS access transistor via the first word line and output a second gate control signal to the second gate of the second MOS access transistor via the second word line, wherein the control circuit is further configured to output a programming control signal and a precharging control signal. The bit line decoding and precharging integration circuit is electrically connected to the control circuit and configured to receive the programming control signal and the precharging control signal from the control circuit, wherein the bit line decoding and precharging integration circuit is further electrically connected to the first bit line and the second bit line. The bit line decoding and precharging integration circuit is further configured to: output a first electrode control signal to the first electrode of the first MOS access transistor via the first bit line and a second electrode control signal to the second electrode of the second MOS access transistor via the second bit line according to a first logic potential combination of the programming control signal and the precharging control signal when the memory cell is in the first writing state; output a first precharging potential via the first bit line and a second precharging potential via the second bit line according to a second logic potential combination of the programming control signal and the precharging control signal when the memory cell is in a precharging state; and make the first bit line stay in a first floating state and the second bit line stay in a second floating state according to a third logic potential combination of the programming control signal and the precharging control signal when the memory cell is in the reading state.

DESCRIPTION

Figure 1:
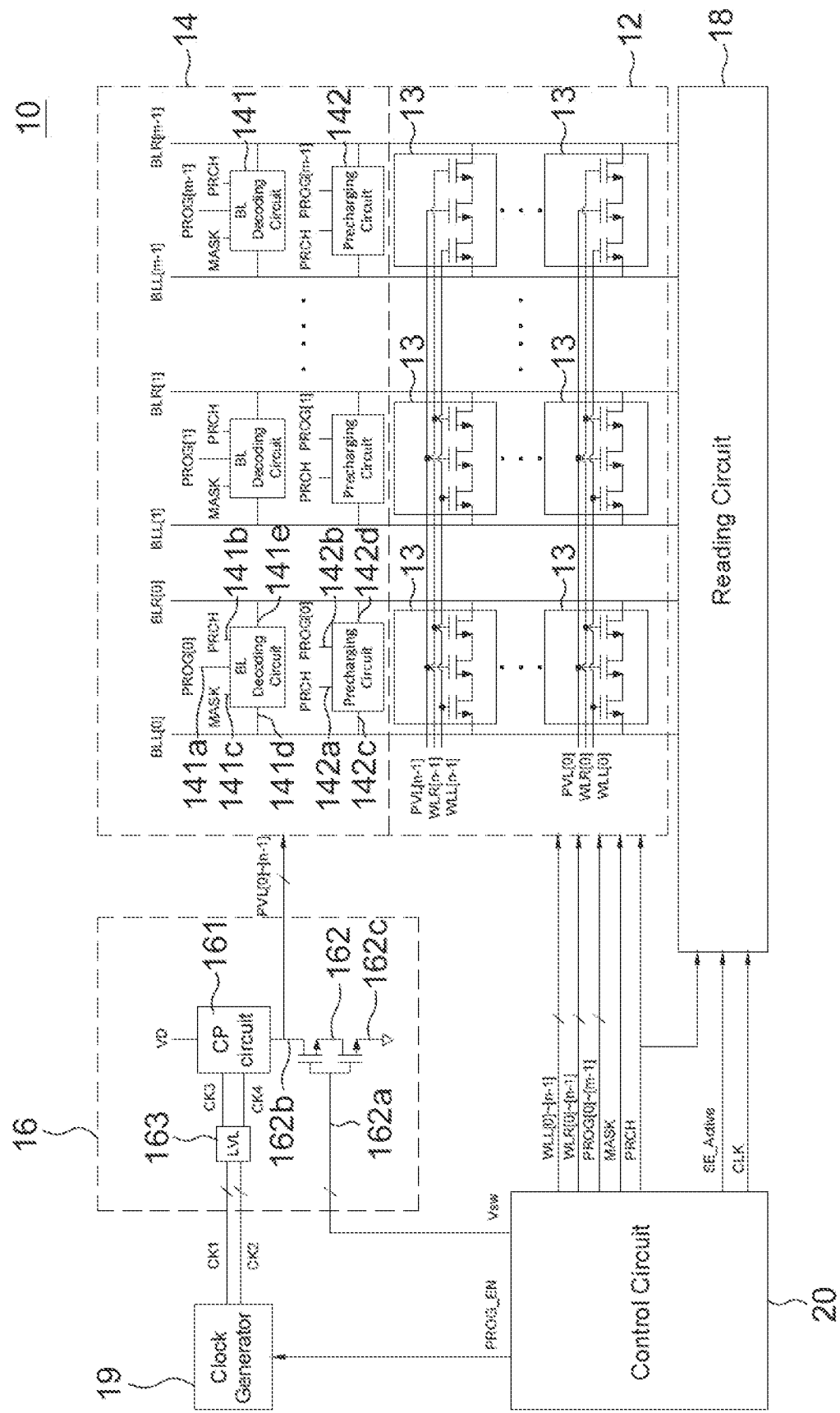
FIG. 1 is a schematic diagram of a multi-state one-time programmable (MSOTP) memory circuit according to one embodiment of the present disclosure.

In the present disclosure, the singular forms "a", "an" and "the" are intended to include the plural forms as well unless the context clearly indicates otherwise.

In addition, the terms "comprises", "comprising", "includes", "including", "has", "having" and the like used in the present disclosure are intended to be open-ended terms that imply the inclusion of the features, elements and/or components disclosed thereof, but do not preclude the presence or addition of one or more other features, elements, components, and/or groups thereof.

Further, the ordinal terms (such as "first", "second", "third", etc.) used in the present disclosure and the claims to modify an element do not by themselves imply any priority, precedence, or order of one element over another element or the temporal order in which steps of a method are performed, but are used merely as labels to distinguish one claimed element having a particular name from another element having a same name.

The spirit of the present invention will be clearly described in the drawings and detailed description below, such that one skilled in the art, after understanding the embodiments of the present disclosure, can make changes and modifications based on the techniques taught in the present invention without departing from the spirit and scope of the present invention.

As shown in FIG. 1, a multi-state one-time programmable (MSOTP) memory circuit 10 includes a memory array circuit 12, a bit line decoding and precharging integration circuit 14, a programming voltage driving circuit 16, a reading circuit 18, a clock generator 19, and a control circuit 20. The memory array circuit 12 is electrically connected to the bit line decoding and precharging integration circuit 14, the programming voltage driving circuit 16, the reading circuit 18, and the control circuit 20. The memory array circuit 12 includes n/m memory cells 13, n first word lines WLL [0] to WLL [n−1], n second word lines WLR [0] to WLR [n−1], n programming voltage control lines PVL [0] to PVL [n−1], m first bit lines BLL [0] to BLL [m−1], and m second bit lines BLR [0] to BLR [m−1]. All the n×m memory cells 13 are the same with each memory cell electrically connected to a corresponding first word line WLL, a corresponding second word line WLR, a corresponding programming voltage control line PVL, a corresponding first bit line BLL and a corresponding second bit line BLR, respectively, as shown in FIG. 2.

Figure 2:
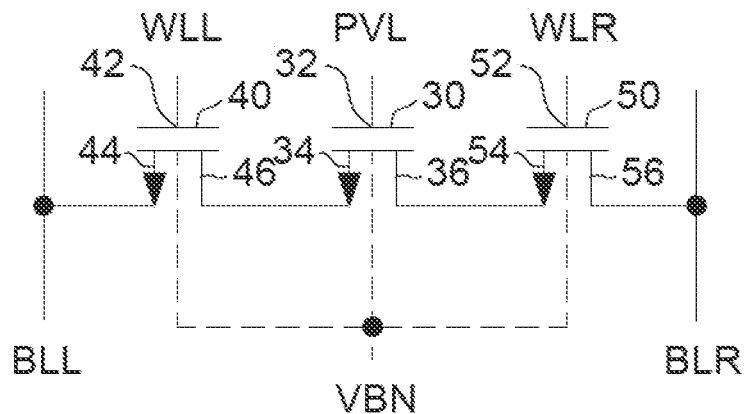
FIG. 2 is an enlarged view of one memory cell shown in FIG. 1.

Referring now to FIG. 2, the memory cell 13 includes a metal oxide semiconductor field effect (MOS) storage transistor 30, a first metal oxide semiconductor field effect (MOS) access transistor 40, and a second metal oxide semiconductor field effect (MOS) access transistor 50. The MOS storage transistor 30 has a gate 32, a first electrode 34 and a second electrode 36. The gate 32 is electrically connected to a programming voltage control line PVL for receiving a writing control potential or a reading control potential from the programming voltage driving circuit 16. A first non-breakdown state or a first breakdown state can exist between the gate 32 and the first electrode 34, and a second non-breakdown state or a second breakdown state can exist between the gate 32 and the second electrode 36. The first MOS access transistor 40 has a first gate 42, a first electrode 44 and a second electrode 46. The first gate electrode 42 is electrically connected to a first word line WLL, the first electrode 44 is electrically connected to a first bit line BLL, and the second electrode 46 is electrically connected to the first electrode 34 of the MOS storage transistor 30. The second MOS access transistor 50 has a second gate 52, a first electrode 54 and a second electrode 56. The second gate electrode 52 is electrically connected to a second word line WLR, the first electrode 54 is electrically connected to the second electrode 36 of the MOS storage transistor 30, and the second electrode 56 is electrically connected to a second bit line BLR. In the present embodiment, that MOS storage transistor 30, the first MOS access transistor 40 and the second MOS access transistor 50 are implement by three NMOS transistors, but not limit thereto. Preferably, when the MOS storage transistor 30, the first MOS access transistor 40 and the second MOS access transistor 50 are implemented by three NMOS transistors, the first electrode 34, the first electrode 44 and the first electrode 54 are sources, and the second electrode 36, the second electrode 46 and the second electrode 56 are drains. In addition, in the present embodiment, the MOS storage transistor 30, the first MOS access transistor 40 and the second MOS access transistor 50 are formed on a P-type semiconductor substrate (not shown), and a contact point VBN on the semiconductor substrate may be grounded, but not limited thereto.

Before the MSOTP memory circuit 10 is programmed with data, a first non-breakdown state exists between the gate 32 and the first electrode 34 of the MOS storage transistor 30, and a second non-breakdown state exists between the gate 32 and the second electrode 36 of the MOS storage transistor 30. In the present embodiment, when the first non-breakdown state exists between the gate electrode 32 and the first electrode 34 of the MOS storage transistor 30, it indicates that a bit "0" is stored between the gate electrode 32 and the first electrode 34 of the MOS storage transistor 30. When the second non-breakdown state exists between the gate electrode 32 and the second electrode 36 of the MOS storage transistor 30, it indicates that another bit "0" is stored between the gate electrode 32 and the second electrode 36 of the MOS storage transistor 30. Therefore, each memory cell 13 disclosed in the present embodiment can store two bits. In other words, before the MSOTP memory circuit 10 is programmed with data, each bit stored in each memory cell 13 of the memory array circuit 12 is "0".

Figure 3A:
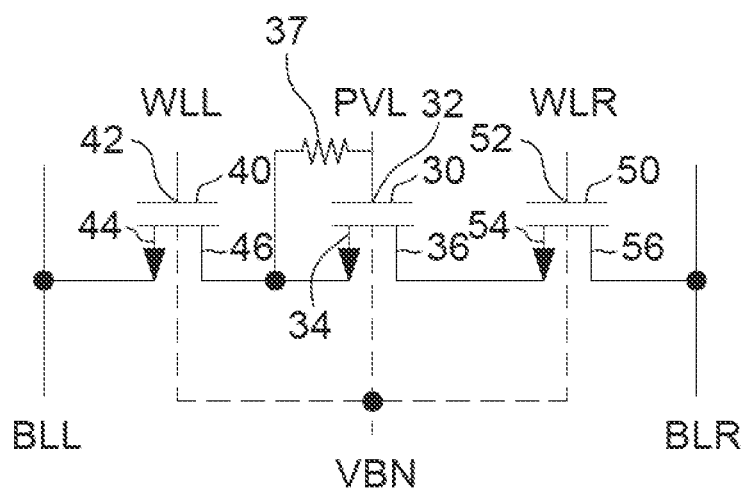
FIG. 3a is an equivalent circuit diagram of the memory cell shown in FIG. 2 with two bits "10" written.
Figure 3B:
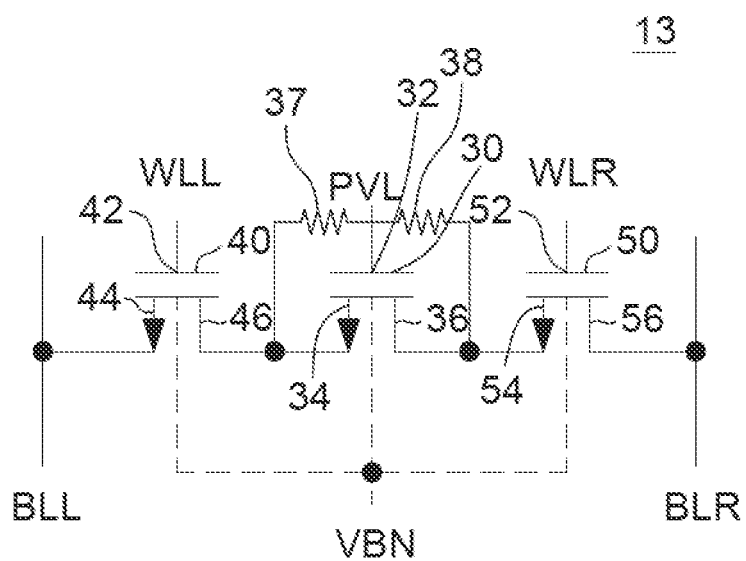
FIG. 3b is an equivalent circuit diagram of the memory cell shown in FIG. 2 with two bits "11" written.

In addition, after the MSOTP memory circuit 10 is programmed for the first time, for example, after two bits "10" are written into the memory cell 13 for the first time, a first breakdown state is formed and maintained between the gate 32 and the first electrode 34 of the MOS storage transistor 30, thereby forming a first equivalent resistor 37 (as shown in FIG. 3a), and a second non-breakdown state is maintained between the gate 32 and the second electrode 36 of the MOS storage transistor 30. Similarly, after two bits "01" are written into the memory cell 13 for the first time, a first non-breakdown state is maintained between the gate 32 and the first electrode 34 of the MOS storage transistor 30, and a second breakdown state is formed and maintained between the gate 32 and the second electrode 36 of the MOS storage transistor 30, thereby forming a second equivalent resistor (not shown). Similarly, after two bits "11" are written into the memory cell 13 for the first time, a first breakdown state is formed and maintained between the gate 32 and the first electrode 34 of the MOS storage transistor 30, thereby forming a first equivalent resistor 37, and a second breakdown state is formed and maintained between the gate 32 and the second electrode 36 of the MOS storage transistor 30, thereby forming a second equivalent resistor 38 (as shown in FIG. 3b). Similarly, after two bits "00" are written into the memory cell 13 for the first time, a first non-breakdown state is maintained between the gate 32 and the first electrode 34 of the MOS storage transistor 30, and a second non-breakdown state is maintained between the gate 32 and the second electrode 36 of the MOS storage transistor 30.

Further, after two bits "00" are written into the memory cell 13 for the first time, the two bits "00" written into the memory cell 13 can be further written as "01", "10" or "11". Alternatively, after two bits "01" or "10" are written into the memory cell 13 for the first time, the two bits "01" or "10" written into the memory cell 13 can be further written as "11". However, after two bits "11" are written into the memory cell 13 for the first time, the two bits "11" written into the memory cell 13 cannot be further written as "01", "10" or "00".

As can be understood from the above, in the present embodiment, the formation or existence of a breakdown state between the gate 32 and the first electrode 34 or between the gate 32 and the second electrode 36 may indicate that a bit "1" is stored, and the existence or maintenance of a non-breakdown state between the gate 32 and the first electrode 34 or between the gate 32 and the second electrode 36 may indicate that a bit "0" is stored. In addition, as can be understood from the above, after a breakdown state is formed between the gate 32 and the first electrode 34 or between the gate 32 and the second electrode 36, an equivalent resistor is formed, and the breakdown state cannot be restored to a non-breakdown state.

The present disclosure provides four writing modes for writing and storing two bits into the memory cell 13 and provides two reading modes for reading two stored bits from the memory cell 13, which will be described below.

In the present embodiment, the control circuit 20 is electrically connected to the memory array circuit 12, the bit line decoding and precharging integration circuit 14, the programming voltage driving circuit 16, the clock generator 19 and the reading circuit 18. The control circuit 20 includes: an enable output terminal electrically connected to the clock generator 19 and configured to output a programming enable signal PROG_EN; a power switching control output terminal electrically connected to the programming voltage driving circuit 16 and configured to output a power switching signal Vsw to the programming voltage driving circuit 16; n first word line control output terminals electrically connected to the n first word lines WLL[0]~WLL[n−1] respectively and configured to respectively output n first gate control signals; n second word line control output terminals electrically connected to the n second word lines WLR[0]~WLR[n−1] respectively and configured to respectively output n second gate control signals; m programming control output terminals electrically connected to the bit line decoding and precharging integration circuit 14 and configured to output m programming control signals PROG[0]~PROG[m−1] to the bit line decoding and precharging integration circuit 14; a masking control output terminal electrically connected to the bit line decoding and precharging integration circuit 14 and configured to output a masking control signal MASK to the bit line decoding and precharging integration circuit 14; a precharging control output terminal electrically connected to the bit line decoding and precharging integration circuit 14 and the reading circuit 18 and configured to output a precharging control signal PRCH to the bit line decoding and precharging integration circuit 14 and the reading circuit 18; a sensing activation output terminal electrically connected to the reading circuit 18 and configured to output a sensing activation control signal SE_Active to the reading circuit 18; and a clock output terminal electrically connected to the reading circuit 18 and configured to output a clock signal CLK to the reading circuit 18. In the present embodiment, each of the first gate control signals includes a first gate control potential (e.g., high potential or low potential) and a second gate control potential (e.g., low potential or high potential), and the first gate control potential and the second gate control potential are opposite to each other in phase. In addition, each of the second gate control signals includes a third gate control potential (e.g., high potential or low potential) and a fourth gate control potential (e.g., low potential or high potential), and the third gate control potential and the fourth gate control potential are opposite to each other in phase.

As shown in FIG. 1, the bit line decoding and precharging integration circuit 14 is electrically connected to the memory array circuit 12, the reading circuit 18 and the control circuit 20, and includes m bit line decoding circuits (BL decoding circuits) 141 and m precharging circuits 142. Each of the BL decoding circuits 141 has a first input terminal 141a for receiving a corresponding programming control signal PROG from a corresponding programming control output terminal of the control circuit 20; a second input terminal 141b for receiving the precharging control signal PRCH from the precharging control output terminal of the control circuit 20; and a third input terminal 141c for receiving the masking control signal MASK from the masking control output terminal of the control circuit 20. In the present embodiment, the programming control signal PROG may include a first programming control potential (e.g., high potential or low potential) and a second programming control potential (e.g., low potential or high potential), and the first programming control potential and the second programming control potential are opposite to each other in phase; the precharging control signal PRCH may include a first precharging control potential (e.g., high potential or low potential) and a second precharging control potential (e.g., low potential or high potential), and the first precharging control potential and the second precharging control potential are opposite to each other in phase; and the masking control signal MASK may include a first masking control potential (e.g., high potential or low potential) and a second masking control potential (e.g., low potential or high potential), and the first masking control potential and the second masking control potential are opposite to each other in phase.

In addition, each of the BL decoding circuits 141 has a first output terminal 141*d* electrically connected to a corresponding first bit line BLL and configured to output a first electrode control signal to the corresponding first bit line BLL. The first electrode control signal may include a first electrode control potential (e.g., high potential or low potential) and a second electrode control potential (e.g., low potential or high potential), and the first electrode control potential and the second electrode control potential are opposite to each other in phase. Each of the BL decoding circuits 141 is configured to selectively output the first electrode control potential or the second electrode control potential from the first output terminal 141*d* to the corresponding first bit line BLL according to different logic potential combinations of the programming control signal PROG, the precharging control signal PRCH and the masking control signal MASK. Furthermore, each of the BL decoding circuits 141 further has a second output terminal 141*e* electrically connected to a corresponding second bit line BLR and configured to output a second electrode control signal to the corresponding second bit line BLR. The second electrode control signal may include a third electrode control potential (e.g., high potential or low potential) and a fourth electrode control potential (e.g., low potential or high potential), and the third electrode control potential and the fourth electrode control potential are opposite to each other in phase. Each of the BL decoding circuits 141 is further configured to selectively output the third electrode control potential or the fourth electrode control potential from the second output terminal 141*e* to the corresponding second bit line BLR according to different logic potential combinations of the programming control signal PROG, the precharging control signal PRCH and the masking control signal MASK.

In addition, as shown in FIG. 1, each of the precharging circuits 142 has a first input 142*a* for receiving the precharging control signal PRCH from the precharging control output terminal of the control circuit 20 and a second input 142*b* for receiving a corresponding programming control signal PROG from a corresponding programming control output terminal of the control circuit 20. In addition, each of the precharging circuits 142 has a first output terminal 142*c* electrically connected to a corresponding first bit line BLL and configured to output a first precharging potential to the corresponding first bit line BLL. Each of the precharging circuits 142 is configured to selectively output the first precharging potential from the first output terminal 142*c* to the corresponding first bit line BLL or make the corresponding first bit line BLL stay in a first floating state according to different logic potential combinations of the precharging control signal PRCH and the programming control signal PROG. Furthermore, each of the precharging circuits 142 further has a second output terminal 142*d* electrically connected to a corresponding second bit line BLR and configured to output a second precharging potential to the corresponding second bit line BLR. Each of the precharging circuits 142 is further configured to selectively output the second precharging potential from the second output terminal 142*d* to the corresponding second bit line BLR or make the corresponding second bit line BLR stay in a second floating state according to different logic potential combinations of the precharging control signal PRCH and the programming control signal PROG.

In the present embodiment, when the memory cell 13 is in a first writing state, the control circuit 20 outputs the first gate control potential (e.g., high potential) to the first gate 42 of the first MOS access transistor 40 via the first word line WLL and outputs the third gate control potential (e.g., high potential) to the second gate 52 of the second MOS access transistor 50 via the second word line WLR. In addition, when the memory cell 13 is in the first writing state, the bit line decoding and precharging integration circuit 14 can output the first electrode control potential (e.g., high potential) or the second electrode control potential (e.g., low potential) to the first electrode 44 of the first MOS access transistor 40 via the first bit line BLL and output the third electrode control potential (e.g., high potential) or the fourth electrode control potential (e.g., low potential) to the second electrode 56 of the second MOS access transistor 50 via the second bit line BLR according to a first logic potential combination of the programming control signal and the precharging control signal, such that the first non-breakdown state exists or the first breakdown state is formed between the gate 32 and the first electrode 34 in the MOS storage transistor 30 and such that the second non-breakdown state exists or the second breakdown state is formed between the gate 32 and the second electrode 36 in the MOS storage transistor 30.

In the present embodiment, when the memory cell 13 is in a precharging state, the bit line decoding and precharging integration circuit 14 can output a first precharging potential (e.g., high potential) to the first electrode 44 of the first MOS access transistor 40 via the first bit line BLL and output a second precharging potential (e.g., high potential) to the second electrode 56 of the second MOS access transistor 50 via the second bit line BLR according to a second logic potential combination of the programming control signal and the precharging control signal. In the present embodiment, the first precharging potential and the second precharging potential are equal.

In addition, after the bit line decoding and precharging integration circuit 14 outputs the first precharging potential and the second precharging potential and/or when the memory cell 13 is in a reading state, the bit line decoding and precharging integration circuit 14 can make the first bit line BLL stay in a first floating state and the second bit line BLR stay in a second floating state according to a third logic potential combination of the programming control signal and the precharging control signal. In one embodiment, when the first non-breakdown state exists between the gate 32 and the first electrode 34 of the MOS storage transistor 30, the first precharging potential is maintained on the first bit line BLL staying in the first floating state. In one embodiment, when the first breakdown state exists between the gate 32 and the first electrode 34 of the MOS storage transistor 30, the first precharging potential on the first bit line staying in the first floating state is discharged to a first discharging potential (e.g., low potential or ground potential) via a ground path. In one embodiment, when the second non-breakdown state exists between the gate 32 and the second electrode 36 of the MOS storage transistor 30, the second precharging potential is maintained on the second bit line BLR staying in the second floating state. In one embodiment, when the second breakdown state exists between the gate 32 and the second electrode 36 of the MOS storage transistor 30, the second precharging potential on the second bit line staying in the second floating state is discharged to a second discharging potential (e.g., low potential or ground potential) via a ground path.

In the present embodiment, when the memory cell 13 is in a second writing state, the bit line decoding and precharging integration circuit 14 can output the second electrode control potential (e.g., low potential) to the first electrode 44 of the first MOS access transistor 40 via the first bit line BLL and output the fourth electrode control potential (e.g., low potential) to the second electrode 56 of the second MOS access transistor 50 via the second bit line BLR according to the first masking control potential and a fourth logic potential combination of the programming control signal and the precharging control signal. In addition, when the memory cell 13 is in the second writing state, the control circuit 20 can output the first gate control potential (e.g., high potential) or the second gate control potential (e.g., low potential) to the first gate 42 of the first MOS access transistor 40 via the first word line WLL and output the third gate control potential (e.g., high potential) or the fourth gate control potential (e.g., low potential) to the second gate 52 of the second MOS access transistor 50 via the second word line WLR, such that the first breakdown state is formed or the first non-breakdown state exists between the gate 32 and the first electrode 34 in the MOS storage transistor 30 and such that the second breakdown state is formed or the second non-breakdown state exists between the gate 32 and the second electrode 36 in the MOS storage transistor 30.

In the present embodiment, when the memory cell 13 is in a third writing state, the control circuit 20 outputs the first gate control potential (e.g., high potential) to the first gate 42 of the first MOS access transistor 40 via the first word line WLL and outputs the third gate control potential (e.g., high potential) to the second gate 52 of the second MOS access transistor 50 via the second word line WLR. In addition, when the memory cell 13 is in the third writing state, the bit line decoding and precharging integration circuit 14 can output the second electrode control potential (e.g., low potential) to the first electrode 44 of the first MOS access transistor 40 via the first bit line BLL and output the fourth electrode control potential (e.g., low potential) to the second electrode 56 of the second MOS access transistor 50 via the second bit line BLR according to the first masking control potential and a fourth logic potential combination of the programming control signal and the precharging control signal, such that the first breakdown state is formed between the gate 32 and the first electrode 34 in the MOS storage transistor 30 and the second breakdown state is formed between the gate 32 and the second electrode 36 in the MOS storage transistor 30 at the same time. In the present embodiment, the second electrode control potential (e.g., low potential) and the fourth electrode control potential (e.g., low potential) are substantially equal.

In the present embodiment, when the memory cell 13 is in a fourth writing state, the control circuit 20 outputs the first gate control potential (e.g., high potential) to the first gate 42 of the first MOS access transistor 40 via the first word line WLL and outputs the third gate control potential (e.g., high potential) to the second gate 52 of the second MOS access transistor 50 via the second word line WLR. In addition, when the memory cell 13 is in the fourth writing state, the bit line decoding and precharging integration circuit 14 can output the first electrode control potential (e.g., high potential) to the first electrode 44 of the first MOS access transistor 40 via the first bit line BLL and output the third electrode control potential (e.g., high potential) to the second electrode 56 of the second MOS access transistor 50 via the second bit line BLR according to the second masking control potential and a fourth logic potential combination of the programming control signal and the precharging control signal, such that the first non-breakdown state exists between the gate 32 and the first electrode 34 in the MOS storage transistor 30 and the second non-breakdown state exists between the gate 32 and the second electrode 36 in the MOS storage transistor 30 at the same time. In the present embodiment, the first electrode control potential (e.g., high potential) and the third electrode control potential (e.g., high potential) are substantially equal.

Figure 4:
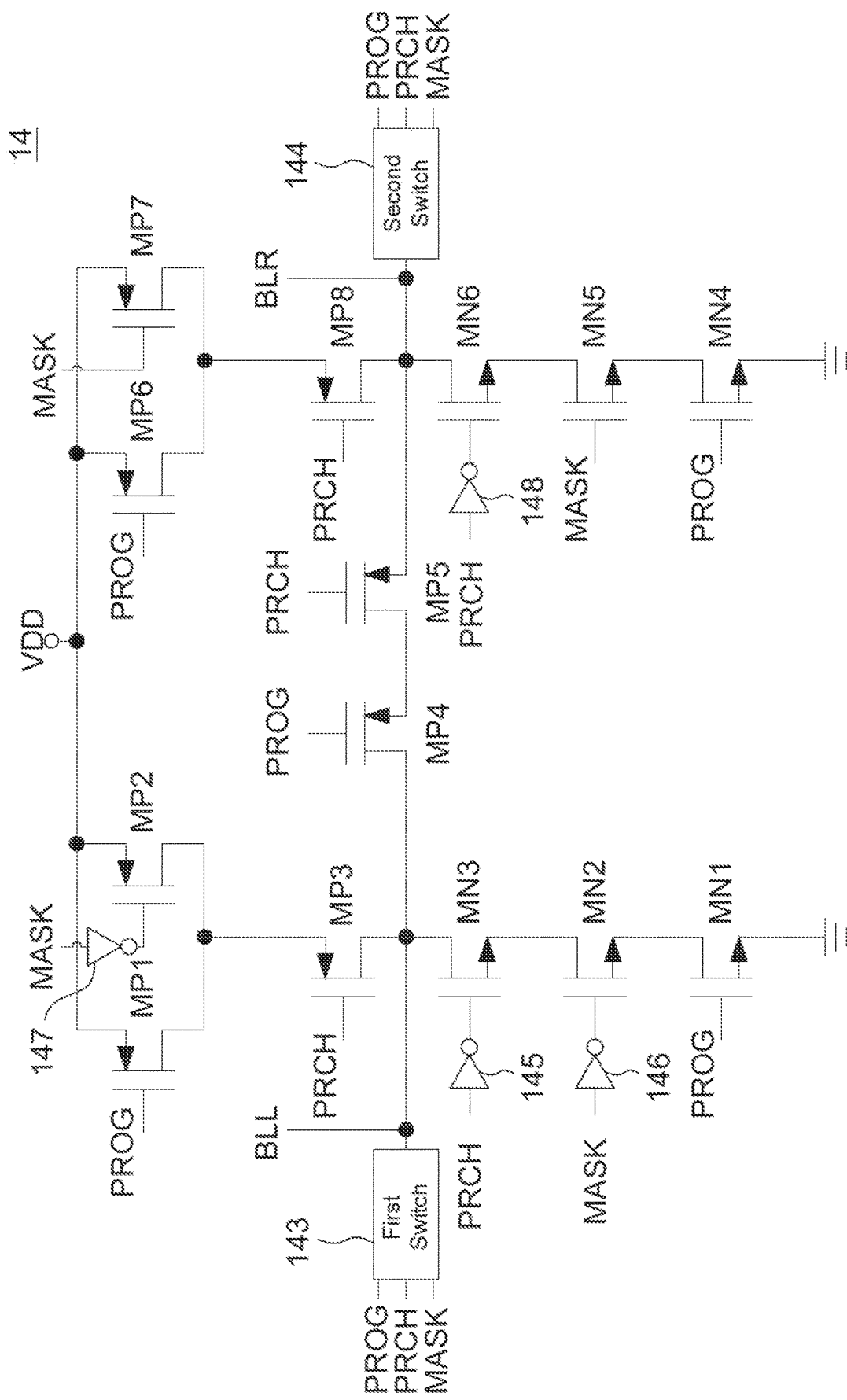
FIG. 4 is a schematic diagram of a bit line decoding and precharging integration circuit according to one embodiment of the present disclosure.

As shown in FIG. 1, the memory cells 13 in each column (e.g., all memory cells 13 electrically connected to the first bit line BLL[0] and the second bit line BLR[0]) are electrically connected to a corresponding BL decoding circuit 141 and a corresponding precharging circuit 142 via a corresponding first bit line BLL (e.g., the first bit line BLL[0]) and a corresponding second bit line BLR (e.g., the second bit line BLR[0]). In the present embodiment, the circuit structures of all the m BL decoding circuits 141 are the same, and the circuit structures of all the m precharging circuits 142 are the same. Therefore, an embodiment of the bit line decoding and precharging integration circuit 14 will be described with a corresponding BL decoding circuit 141 and a corresponding precharging circuit 142 electrically connected to the first bit line BLL [0] and the second bit line BLR [0] as an example. It should be understood that the bit line decoding and precharging integration circuit 14 can be implemented by the circuit shown in FIG. 4 but is not limited thereto. In FIG. 4, the corresponding BL decoding circuit 141 and the corresponding precharging circuit 142 are integrated in the same circuit to form the bit line decoding and precharging integration circuit 14. The bit line decoding and precharging integration circuit 14 shown in FIG. 4 includes a first switch 143, a second switch 144, a first NOT gate 145, a second NOT gate 146, a third NOT gate 147, a fourth NOT gate 148, eight PMOS transistors MP1, MP2, MP3, MP4, MP5, MP6, MP7, and MP8, and six NMOS transistors MN1, MN2, MN3, MN4, MN5, and MN6. The electrical connections among the PMOS transistors, the NMOS transistors and the NOT gates have been clearly shown in FIG. 4 and thus are not described in detail herein.

As shown in FIG. 4, the first switch 143 has an output terminal electrically connected to the first bit line BLL and can pull a potential on the first bit line BLL to a first potential (e.g., high potential or low potential) or a second potential (e.g., low potential or high potential) according to different logic potential combinations of the programming control signal PROG, the precharging control signal PRCH and the masking control signal MASK, so as to be used by the memory cell 13 in a writing state or a reading state. The second switch 144 has an output terminal electrically connected to the second bit line BLR and can pull a potential on the second bit line BLR to a first potential (e.g., high potential or low potential) or a second potential (e.g., low potential or high potential) according to different logic potential combinations of the programming control signal PROG, the precharging control signal PRCH and the masking control signal MASK, so as to be used by the memory cell 13 in a writing state or a reading state. In the present embodiment, the first switch 143 and the second switch 144 can be implemented by various logic circuits to achieve the above functions and purposes, and therefore, the design details thereof are not described herein. Furthermore, the bit line decoding and precharging integration circuit 14 can receive the programming control signal PROG, the precharging control signal PRCH and the masking control signal MASK from the control circuit 20 and control the potentials output to the first bit line BLL and the second bit line BLR or make the first bit line BLL and the second bit line BLR stay in a floating state according to different logic potential combinations of the programming control signal PROG, the precharging control signal PRCH and the masking control signal MASK, which will be described in more details below.

Referring again to FIG. 1, that clock generator 19 is electrically coupled between the control circuit 20 and the programming voltage driving circuit 16 and configured to receive the programming enable signal PROG_EN from the control circuit 20 and be activated according to the programming enable signal PROG_EN. When the clock generator 19 is activated, the clock generator 19 can output a first clock signal CK1 and a second clock signal CK2 (e.g., clock signals with 0V to 0.8V) to the programming voltage driving circuit 16 to activate the programming voltage driving circuit 16. In the present embodiment, the potentials of the first clock signal CK1 and the second clock signal CK2 are opposite to each other.

The programming voltage driving circuit 16 includes a charge pump circuit (CP circuit) 161, a power switch 162 and a level shifter (LVL circuit) 163. The level shifter 163 is electrically connected between the clock generator 19 and the CP circuit 161 and configured to receive the first clock signal CK1 and the second clock signal CK2 from the clock generator 19, convert the first clock signal CK1 and the second clock signal CK2 into a third clock signal CK3 and a fourth clock signal CK4 (e.g., clock signals with 2.5V to 4.8V) and output the third clock signal CK3 and the fourth clock signal CK4 to the CP circuit 161. The CP circuit 161 is electrically connected to the level shifter 163, the power switch 162 and the bit line decoding and precharging integration circuit 14. The CP circuit 161 has a voltage input terminal for receiving a direct current (DC) voltage VD and a voltage output terminal electrically connected to the gate 32 of the MOS storage transistor 30 in a corresponding memory cell 13 via a corresponding programming voltage control line PVL. The CP circuit 161 is configured to receive the DC voltage VD from the voltage input terminal, boost the DC voltage VD according to the third clock signal CK3 and the fourth clock signal CK4 to generate the writing control potential, and output the writing control potential to the gate 32 of the MOS storage transistor 30 via the voltage output terminal. The power switch 162 has a first connection terminal 162a, a second connection terminal 162b and a third connection terminal 162c. The power switch is configured to receive the power switching signal Vsw from the control circuit 20 via the first connection terminal 162a and control the CP circuit 161 to output one of the writing control potential and the reading control potential to the gate 32 of the MOS storage transistor 30 according to the power switching signal Vsw. In addition, the power switch 162 is electrically connected to the voltage output terminal of the CP circuit 161 and the corresponding programming voltage control line PVL via the second connection terminal 162b, and the power switch 162 is grounded via the third connection terminal 162c.

In one embodiment, that programming voltage driving circuit 16 can be implemented by n programming voltage driving circuits 16, which are respectively and electrically connected to n programming voltage control lines PLV[0] ~PLV[n−1] for outputting a writing control potential or a reading control potential to each row of memory cells 13.

In the present embodiment, the power switching signal Vsw includes a first switching potential and a second switching potential. When the memory cell 13 is in a writing state, the power switch 162 can control the CP circuit 161 to output the writing control potential to the gate 32 of the MOS storage transistor 30 according to the first switching potential. On the other hand, when the memory cell 13 is in a reading state, the power switch 162 can change the writing control potential to the reading control potential according to the second switching potential, so as to control the CP circuit 161 to output the reading control potential to the gate 32 of the MOS storage transistor 30.

The present disclosure provides four writing modes, each of which will be described below.

First Writing Mode: Writing Two Bits of Data in Sequence Under Control of Bit Lines In the first writing mode, the two bits to be written into the memory cell 13 are controlled by the first bit line BLL and the second bit line BLR as shown in FIG. 2 to determine whether to be written into the memory cell 13. With the first writing mode, the two bits "00" stored in the memory cell 13 can be further written as "10" and "01", the two bits "10" stored in the memory cell 13 can be further written as "11", or the two bits "01" stored in the memory cell 13 can be further written as "11".

In the present embodiment, the first writing mode of the present disclosure will be described with an example that the two bits "00" stored in the memory cell 13 are further written as "10" and then written as "11".

Figure 7:
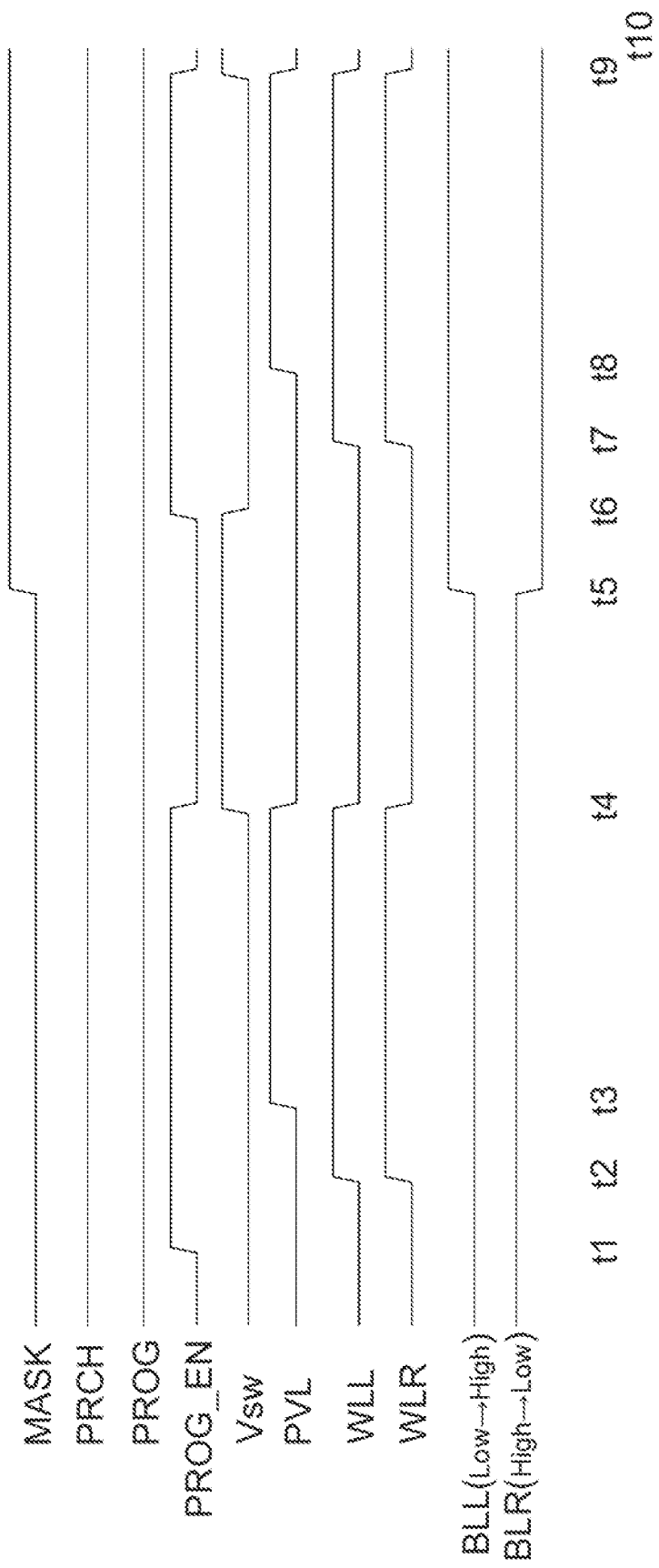
FIG. 7 is a signal timing diagram of an MSOTP memory circuit in a first writing mode according to one embodiment of the present disclosure.

FIG. 7 is a signal timing diagram of an MSOTP memory circuit in a first writing mode according to one embodiment of the present disclosure. Referring to FIG. 1, FIG. 2, and FIG. 7, when the memory cell 13 is in a first writing state, the first writing mode of the present embodiment will be adopted and described below.

Time t1 to t2: The control circuit 20 generates the programming enable signal PROG_EN to activate the programming voltage driving circuit 16. During time t1 to t5, the bit line decoding and precharging integration circuit 14 can output the second electrode control potential (e.g., low potential) to the first electrode 44 of the first MOS access transistor 40 via the first bit line BLL and output the third electrode control potential (e.g., high potential) to the second electrode 56 of the second MOS access transistor 50 via the second bit line BLR according to the first masking control potential (e.g., low potential) and the first logic potential combination of the programming control signal PROG (e.g., high potential) and the precharging control signal PRCH (e.g., low potential).

Time t2 to t3: The control circuit 20 outputs the first gate control potential (e.g., high potential) to the first gate 42 of the first MOS access transistor 40 via the first word line WLL and outputs the third gate control potential (e.g., high potential) to the second gate 52 of the second MOS access transistor 50 via the second word line WLR.

Time t3 to t4: The programming voltage driving circuit 16 outputs the writing control potential (e.g., high potential) to the gate 32 of the MOS storage transistor 30 via a corresponding programming voltage control line PVL.

Time t4 to t5: The control circuit 20 switches its outputted power switching signal Vsw from the second switching potential (e.g., low potential) to the first switching potential (e.g., high potential), such that the programming voltage driving circuit 16 stops outputting the writing control potential (e.g., high potential) to the gate 32 of the MOS storage transistor 30 to complete writing two bits "10", that is, a first breakdown state is formed between the gate 32 and the first electrode 34 in the MOS storage transistor 30, and a second non-breakdown state exists between the gate 32 and the second electrode 36 in the MOS storage transistor 30.

Time t5 to t6: The control circuit 20 switches its outputted masking control signal MASK from the first masking control potential (e.g., low potential) to the second masking control potential (e.g., high potential), such that the bit line decoding and precharging integration circuit 14 outputs the first electrode control potential (e.g., high potential) to the first electrode 44 of the first MOS access transistor 40 via the first bit line BLL and output the fourth electrode control potential (e.g., low potential) to the second electrode 56 of the second MOS access transistor 50 via the second bit line BLR according to the second masking control potential (e.g., high potential) and the first logic potential combination.

Time t6 to t7: The control circuit 20 generates the programming enable signal PROG_EN to activate the programming voltage driving circuit 16, and the control circuit 20 switches its outputted power switching signal Vsw from the first switching potential (e.g., high potential) to the second switching potential (e.g., low potential).

Time t7 to t8: The control circuit 20 outputs the first gate control potential (e.g., high potential) to the first gate 42 of the first MOS access transistor 40 via the first word line WLL and outputs the third gate control potential (e.g., high potential) to the second gate 52 of the second MOS access transistor 50 via the second word line WLR.

Time t8 to t9: The programming voltage driving circuit 16 outputs the writing control potential (e.g., high potential) to the gate 32 of the MOS storage transistor 30 via the corresponding programming voltage control line PVL.

Time t9 to t10: The control circuit 20 switches its outputted power switching signal Vsw from the second switching potential (e.g., low potential) to the first switching potential (e.g., high potential), such that the programming voltage driving circuit 16 stops outputting the writing control potential (e.g., high potential) to the gate 32 of the MOS storage transistor 30 to complete writing two bits "11", that is, the first breakdown state is maintained between the gate 32 and the first electrode 34 in the MOS storage transistor 30, and the second non-breakdown state between the gate 32 and the second electrode 36 in the MOS storage transistor 30 is changed to a second breakdown state.

When the two bits "00" stored in the memory cell 13 are further written as "01" and then written as "11" with the first writing mode of the present embodiment, its writing process is substantially the same as the writing process as illustrated in FIG. 7, so it will not be described in detail. Here, only the difference will be described below. The masking control signal MASK can present the second masking control potential (e.g., high potential) during the time t1 to t5 to make the bit line decoding and precharging integration circuit 14 to output the first electrode control potential (e.g., high potential) to the first electrode 44 of the first MOS access transistor 40 via the first bit line BLL and output the fourth electrode control potential (e.g., low potential) to the second electrode 56 of the second MOS access transistor 50 via the second bit line BLR; and the masking control signal MASK will be switched from the second masking control potential (e.g., high potential) to the first masking control potential (e.g., low potential) at the time t5, such that the bit line decoding and precharging integration circuit 14 outputs the second electrode control potential (e.g., low potential) to the first electrode 44 of the MOS access transistor 40 via the first bit line BLL and outputs the third electrode control potential (e.g., high potential) to the second electrode 56 of the MOS access transistor 50 via the second bit line BLR according to the first masking control potential (e.g., low potential) and the first logic potential combination.

Second Writing Mode: Writing Two Bits of Data in Sequence Under Control of Word Lines In the second writing mode, the two bits to be written into the memory cell 13 are controlled by the first word line WLL and the second word line WLR as shown in FIG. 2 to determine whether to be written into the memory cell 13. With the second writing mode, the two bits "00" stored in the memory cell 13 can be further written as "10" and "01", the two bits "10" stored in the memory cell 13 can be further written as "11", or the two bits "01" stored in the memory cell 13 can be further written as "11".

In the present embodiment, the second writing mode of the present disclosure will be described with an example that the two bits "00" stored in the memory cell 13 are further written as "10" and then written as "11".

Figure 8:
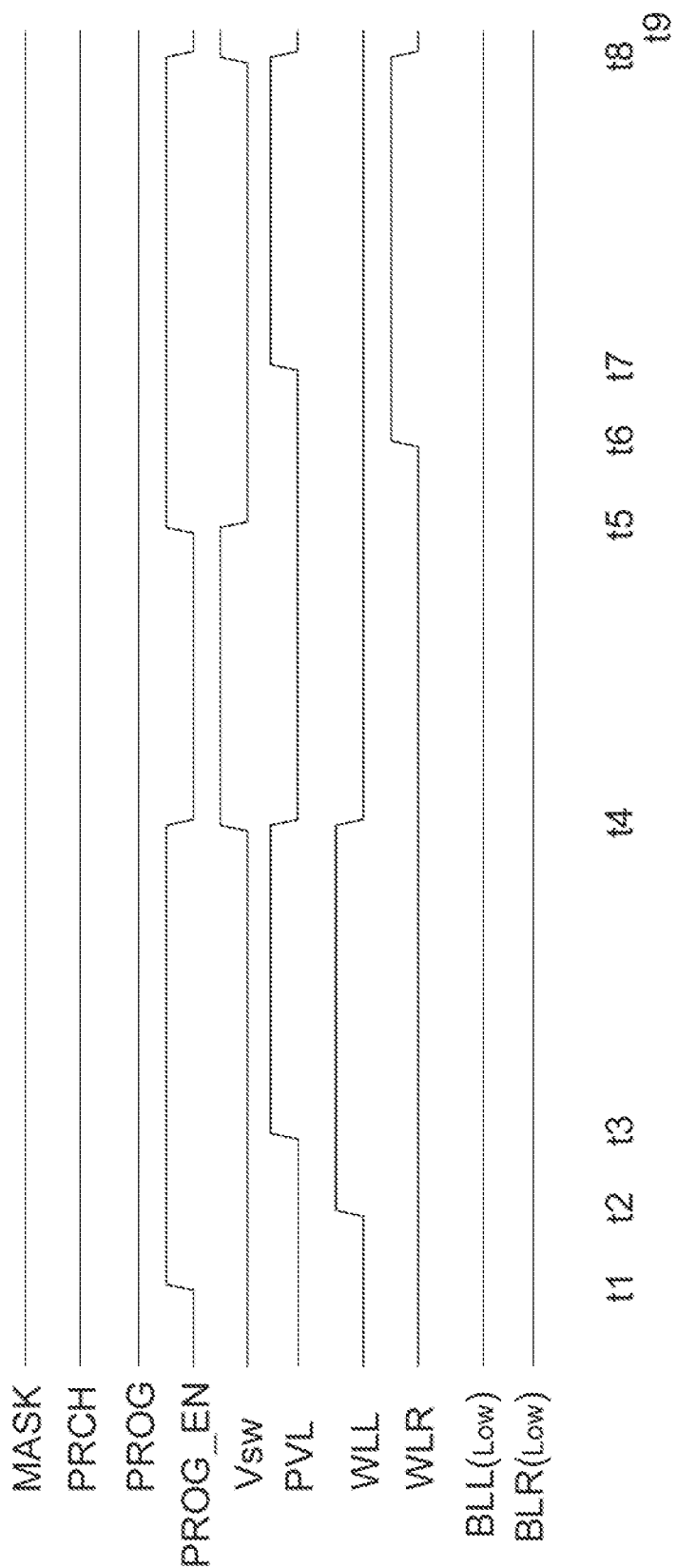
FIG. 8 is a signal timing diagram of an MSOTP memory circuit in a second writing mode according to one embodiment of the present disclosure.

FIG. 8 is a signal timing diagram of an MSOTP memory circuit 10 in a second writing mode according to one embodiment of the present disclosure. Referring to FIG. 1, FIG. 2, and FIG. 8, when the memory cell 13 is in a second writing state, the second writing mode of the present embodiment will be adopted and described below.

Time t1 to t2: The control circuit 20 generates the programming enable signal PROG_EN to activate the programming voltage driving circuit 16. During time t1 to t5, the bit line decoding and precharging integration circuit 14 can output the second electrode control potential (e.g., low potential) to the first electrode 44 of the first MOS access transistor 40 via the first bit line BLL and output the fourth electrode control potential (e.g., low potential) to the second electrode 56 of the second MOS access transistor 50 via the second bit line BLR according to the first masking control potential (e.g., low potential) and the fourth logic potential combination of the programming control signal PROG (e.g., high potential) and the precharging control signal PRCH (e.g., high potential).

Time t2 to t3: The control circuit 20 outputs the first gate control potential (e.g., high potential) to the first gate 42 of the first MOS access transistor 40 via the first word line WLL and outputs the fourth gate control potential (e.g., low potential) to the second gate 52 of the second MOS access transistor 50 via the second word line WLR.

Time t3 to t4: The programming voltage driving circuit 16 outputs the writing control potential (e.g., high potential) to the gate 32 of the MOS storage transistor 30 via a corresponding programming voltage control line PVL.

Time t4 to t5: The control circuit 20 switches its outputted power switching signal Vsw from the second switching potential (e.g., low potential) to the first switching potential (e.g., high potential), such that the programming voltage driving circuit 16 stops outputting the writing control potential (e.g., high potential) to the gate 32 of the MOS storage transistor 30 to complete writing two bits "10", that is, a first breakdown state is formed between the gate 32 and the first electrode 34 in the MOS storage transistor 30, and a second non-breakdown state exists between the gate 32 and the second electrode 36 in the MOS storage transistor 30. At time t4, the control circuit 20 outputs the second gate control potential (e.g., low potential) to the first gate 42 of the first MOS access transistor 40 via the first word line WLL.

Time t5 to t6: The control circuit 20 generates the programming enable signal PROG_EN to activate the programming voltage driving circuit 16, and the control circuit 20 switches its outputted power switching signal Vsw from the first switching potential (e.g., high potential) to the second switching potential (e.g., low potential).

Time t6 to t7: The control circuit 20 keeps outputting the second gate control potential (e.g., low potential) to the first gate 42 of the first MOS access transistor 40 via the first word line WLL and outputs the third gate control potential (e.g., high potential) to the second gate 52 of the second MOS access transistor 50 via the second word line WLR.

Time t7 to t8: The programming voltage driving circuit 16 outputs the writing control potential (e.g., high potential) to the gate 32 of the MOS storage transistor 30 via the corresponding programming voltage control line PVL.

Time t8 to t9: The control circuit 20 switches its outputted power switching signal Vsw from the second switching potential (e.g., low potential) to the first switching potential (e.g., high potential), such that the programming voltage driving circuit 16 stops outputting the writing control potential (e.g., high potential) to the gate 32 of the MOS storage transistor 30 to complete writing two bits "11", that is, the first breakdown state is maintained between the gate 32 and the first electrode 34 in the MOS storage transistor 30, and the second non-breakdown state between the gate 32 and the second electrode 36 in the MOS storage transistor 30 is changed to a second breakdown state.

When the two bits "00" stored in the memory cell 13 are further written as "01" and then written as "11" with the second writing mode of the present embodiment, its writing process is substantially the same as the writing process as illustrated in FIG. 8, so it will not be described in detail. Here, only the difference will be described below. During time t2 to t4, the control circuit 20 can output the second gate control potential (e.g., low potential) to the first gate 42 of the first MOS access transistor 40 via the first word line WLL and output the third gate control potential (e.g., high potential) to the second gate 52 of the second MOS access transistor 50 via the second word line WLR; and the control circuit 20 can output the fourth gate control potential (e.g., low potential) to the second gate 52 of the second MOS access transistor 50 via the second word line WLR at the time t4 and can output the first gate control potential (e.g., high potential) to the first gate 42 of the first MOS access transistor 40 via the first word line WLL and keep outputting the fourth gate control potential (e.g., low potential) to the second gate 52 of the second MOS access transistor 50 via the second word line WLR during the time t6 to t7.

Third Writing Mode: Writing Two Bits of Data "11" at the Same Time

In the third writing mode, two bits "11" can be written into the memory cell 13 at the same time. With the third writing mode, the two bits "00" stored in the memory cell 13 can be further written as "11" at the same time.

In the present embodiment, the third writing mode of the present disclosure will be described with an example that the two bits "00" stored in the memory cell 13 are further written as "11" at the same time.

Figure 9:
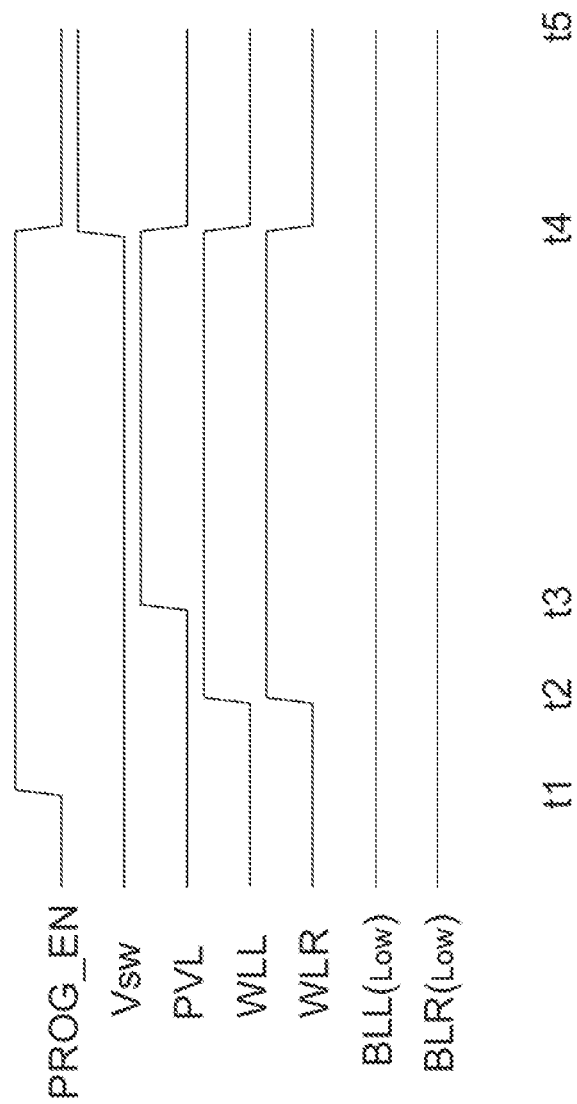
FIG. 9 is a signal timing diagram of an MSOTP memory circuit in a third writing mode according to one embodiment of the present disclosure.

FIG. 9 is a signal timing diagram of an MSOTP memory circuit 10 in a third writing mode according to one embodiment of the present disclosure. Referring to FIG. 1, FIG. 2, and FIG. 9, when the memory cell 13 is in a third writing state, the third writing mode of the present embodiment will be adopted and described below.

Time t1 to t2: The control circuit 20 generates the programming enable signal PROG_EN to activate the programming voltage driving circuit 16, and the bit line decoding and precharging integration circuit 14 can output the second electrode control potential (e.g., low potential) to the first electrode 44 of the first MOS access transistor 40 via the first bit line BLL and output the fourth electrode control potential (e.g., low potential) to the second electrode 56 of the second MOS access transistor 50 via the second bit line BLR according to the first masking control potential (e.g., low potential) and the fourth logic potential combination of the programming control signal PROG (e.g., high potential) and the precharging control signal PRCH (e.g., high potential).

Time t2 to t3: The control circuit 20 outputs the first gate control potential (e.g., high potential) to the first gate 42 of the first MOS access transistor 40 via the first word line WLL and outputs the third gate control potential (e.g., high potential) to the second gate 52 of the second MOS access transistor 50 via the second word line WLR.

Time t3 to t4: The programming voltage driving circuit 16 outputs the writing control potential (e.g., high potential) to the gate 32 of the MOS storage transistor 30 via a corresponding programming voltage control line PVL.

Time t4 to t5: The control circuit 20 switches its outputted power switching signal Vsw from the second switching potential (e.g., low potential) to the first switching potential (e.g., high potential), such that the programming voltage driving circuit 16 stops outputting the writing control potential (e.g., high potential) to the gate 32 of the MOS storage transistor 30 to complete writing two bits "11", that is, a first breakdown state is formed between the gate 32 and the first electrode 34 in the MOS storage transistor 30, and a second breakdown state is formed between the gate 32 and the second electrode 36 in the MOS storage transistor 30.

Fourth Writing Mode: Writing Two Bits of Data "00" at the Same Time

In the fourth writing mode, two bits "00" can be written into the memory cell 13 at the same time. With the fourth writing mode, the two bits "00" stored in the memory cell 13 can be further written as "00" at the same time.

In the present embodiment, when the memory cell 13 is in a fourth writing state, the fourth writing mode of the present embodiment will be adopted. In addition, the writing mode for writing two bits "00" into the memory cell 13 at the same time is substantially the same as the third writing mode illustrated in FIG. 9, so it will not be described in detail. Here, only the difference will be described below. During the time t1 to t2, the bit line decoding and precharging integration circuit 14 can output the first electrode control potential (e.g., high potential) to the first electrode 44 of the first MOS access transistor 40 via the first bit line BLL and output the third electrode control potential (e.g., high potential) to the second electrode 56 of the second MOS access transistor 50 via the second bit line BLR according to the second masking control potential (e.g., high potential) and the fourth logic potential combination of the programming control signal PROG (e.g., high potential) and the precharging control signal PRCH (e.g., high potential), thereby achieving the objective of writing two bits "00" into the memory cell 13 at the same time.

Figure 5:
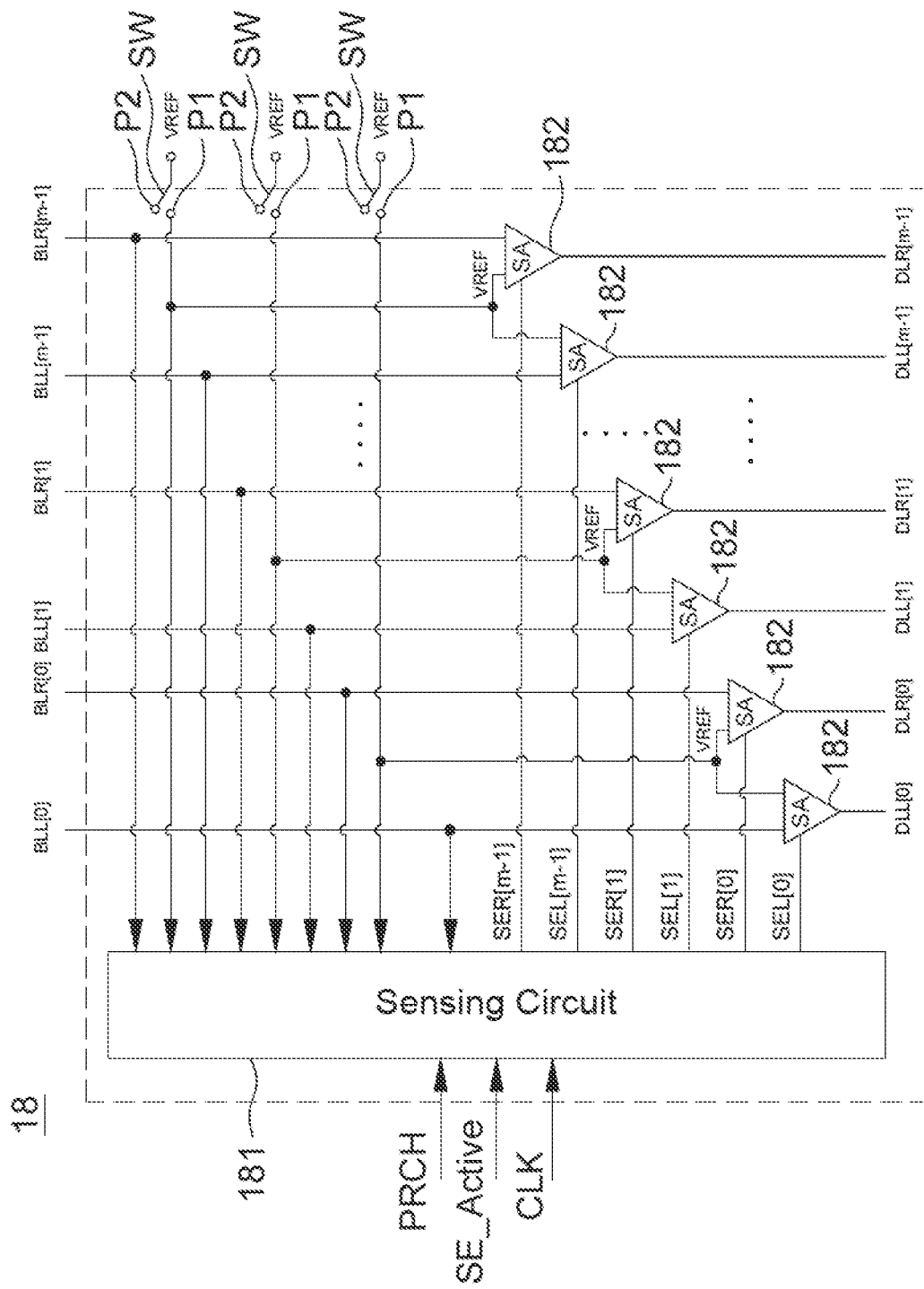
FIG. 5 is a schematic diagram of a reading circuit according to one embodiment of the present disclosure.

As shown in FIG. 5, the reading circuit 18 includes a plurality of reference voltage VREF, a plurality of switching elements SW, a plurality of reference voltage lines P1, a plurality of voltage comparator 182 and a sensing circuit 181. Each of the reference voltage lines P1 is selectively electrically connected to or electrically disconnected from the reference voltage VREF via a corresponding switching element SW. Each of the switching elements has a contact P2. When the switching element SW is in a conducting state, the contact P2 can be electrically connected to the reference voltage line P1. When the switching element SW is in an off state, the contact P2 can be electrically disconnected from the reference voltage line P1. When the memory cell 13 is in the precharging state, the switching element SW can be switched from the off state to the conducting state, such that the reference voltage VREF provides a reference potential on the reference voltage line P1. After the reference voltage VREF provides the reference potential on the reference voltage line P1, the switching element SW can be switched from the conducting state to the off state, such that the reference voltage line P1 is electrically disconnected from the reference voltage VREF, so as to cause the reference potential on the reference voltage line P1 to be discharged to a third discharging potential.

In addition, each of the voltage comparators 182 has two input terminals and an output terminal. Each two adjacent voltage comparators 182 (e.g., a first voltage comparator and a second voltage comparator) of the plurality of voltage comparators 182 are electrically connected to a corresponding memory cell 13 via a corresponding first bit line BLL (e.g., the first bit line BLL[0]) and a corresponding second bit line BLR (e.g., the second bit line BLR[0]), respectively. For example, the two leftmost adjacent voltage comparators 182 shown in FIG. 5 are taken as an example, in which the two leftmost adjacent voltage comparators 182 can be respectively referred to as a first voltage comparator 182 (located on the left side) and a second voltage comparator 182 (located on the right side). The first voltage comparator 182 has two input terminals and an output terminal, and one of the two input terminals is electrically connected to the first bit line BLL [0] and another one of the two input terminals is electrically connected to a corresponding reference voltage line P1. When the memory cell 13 is in a reading state, the first voltage comparator 182 receives a first precharging potential or a first discharging potential from the first bit line BLL [0] staying in the first floating state via one of the two input terminals and receives a third discharging potential from the corresponding reference voltage line P1 via another one of the two input terminals. The second voltage comparator 182 has two input terminals and an output terminal, and one of the two input terminals is electrically connected to the second bit line BLR [0] and another one of the two input terminals is electrically connected to the corresponding reference voltage line P1. When the memory cell 13 is in the reading state, the second voltage comparator 182 receives a second precharging potential or a second discharging potential from the second bit line BLR [0] staying in the second floating state via one of the two input terminals and receives the third discharging potential from the corresponding reference voltage line P1 via the other of the two input terminals. In one embodiment, the first discharging potential (e.g., low potential) and the third discharging potential (e.g., high potential) are opposite to each other in phase, and the second discharging potential (e.g., low potential) and the third discharging potential (e.g., high potential) are opposite to each other in phase. In one embodiment, the first precharging potential (e.g., high potential) and the third discharging potential (e.g., high potential) are in the same phase, and the second precharging potential (e.g., high potential) and the third discharging potential (e.g., high potential) are in the same phase.

In the present embodiment, the sensing circuit 181 is electrically connected to the plurality of reference voltage lines P1, the m first bit lines BLL[0]~BLL[m−1] and the m second bit lines BLR[0]~BLR [m−1]. When the memory cell 13 is in the reading state, the sensing circuit 181 receives the first precharging potential or the first discharging potential from the first bit line BLL (e.g., the first bit line BLL[0]) staying in the first floating state, receives the second precharging potential or the second discharging potential from the second bit line BLR (e.g., the second bit line BLR[0]) staying in the second floating state, and receives the third discharging potential from the reference voltage line P1. When the sensing circuit 181 receives the first discharging potential from the first bit line BLL (e.g., the first bit line BLL[0]) staying in the first floating state, the sensing circuit 181 can output a first activation potential to the first voltage comparator 182 via an activation output terminal SEL (e.g., SEL[0]) according to the first discharging potential and the third discharging potential. When the sensing circuit 181 receives the first precharging potential from the first bit line BLL (e.g., the first bit line BLL[0]) staying in the first floating state, the sensing circuit 181 can output a first non-activation potential to the first voltage comparator 182 according to the first precharging potential and the third discharging potential via the activation output terminal SEL (e.g., SEL[0]). When the sensing circuit 181 receives the second discharging potential from the second bit line BLR (e.g., the second bit line BLR[0]) staying in the second floating state, the sensing circuit 181 can output a second activation potential to the second voltage comparator 182 via an activation output terminal SER (e.g., SER[0]) according to the second discharging potential and the third discharging potential. When the sensing circuit 181 receives the second precharging potential from the second bit line BLR (e.g., the second bit line BLR[0]) staying in the second floating state, the sensing circuit 181 can output a second non-activation potential to the second voltage comparator 182 via the activation output terminal SER (e.g., SER[0]) according to the second precharging potential and the third discharging potential.

In one embodiment, when that first voltage comparator 182 receives the first activation potential, the first voltage comparator 182 is activated to compare the first discharging potential with the third discharging potential and output a first data bit (e.g., 1) according to a first comparison result. When the first voltage comparator 182 receives the first non-activation potential, the first voltage comparator 182 is not activated and directly outputs a second data bit (e.g., 0). In the present embodiment, the first data bit and the second data bit are opposite to each other in phase. When that second voltage comparator 182 receive the second activation potential, the second voltage comparator 182 is activated to compare the second discharging potential with the third discharging potential and output a third data bit (e.g., 1) according to a second comparison result. When the second voltage comparator 182 receives the second non-activation potential, the second voltage comparator 182 is not activated and directly outputs a fourth data bit (e.g., 0). In the present embodiment, the third data bit and the fourth data bit are opposite to each other in phase.

Referring now to FIG. 1 and FIG. 5, when the memory cell enters the reading state, the control circuit 20 outputs the sensing activation control signal SE_Active and the clock signal CLK to the reading circuit 18 to activate the reading circuit 18 to read the two bits stored in each memory cell 13. In one embodiment, the control circuit 20 can further output the precharging control signal PRCH to the reading circuit 18, and the reading circuit 18 can determine whether to output the first activation potential or the second activation potential according to the potential of the precharging control signal PRCH.

Figure 6:
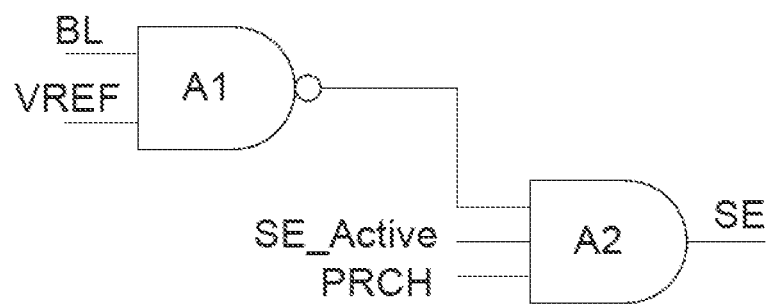
FIG. 6 is a schematic diagram of a sensing circuit according to one embodiment of the present disclosure.

In one embodiment, the sensing circuit 181 can include a plurality of logic combination circuits for generating the first activation potential, the second activation potential, the first non-activation potential or the second non-activation potential, and each logic combination circuit can include a NAND gate A1 and an AND gate A2 as shown in FIG. 6. In the present embodiment, each logic combination circuit has an output terminal SE electrically connected to a corresponding voltage comparator for outputting an activation potential or a non-activation potential to the corresponding voltage comparator. In the above embodiment, the first voltage comparator 182 and the second voltage comparator 182 can be electrically connected to two logic combination circuits as shown in FIG. 6, respectively. For example, the output terminal SE of a first logic combination circuit is the activation output terminal SEL [0] shown in FIG. 5, and the output terminal SE of a second logic combination circuit is the activation output terminal SER [0] shown in FIG. 5. The first logic combination circuit (see FIG. 6) includes a first NAND gate A1 and a first AND gate A2. The first NAND gate A1 is configured to receive the first discharging potential (e.g., low potential) or the first precharging potential (e.g., high potential) via a first input terminal BL, receive the third discharging potential (e.g., high potential) via a second input terminal VREF, and output a first logic potential (e.g., high potential) or a second logic potential (e.g., low potential) according to the first discharging potential and the third discharging potential or according to the first precharging potential and the third discharging potential. The first AND gate A2 is configured to receive the first logic potential (e.g., high potential) or the second logic potential (e.g., low potential) from the first NAND gate A1 and receive a potential of the precharging control signal PRCH and a potential of the sensing activation control signal SE_Active from the control circuit 20, and the first AND gate A2 is further configured to generate the first activation potential or the first non-activation potential according to the potential of the precharging control signal, the potential of the sensing activation control signal SE_Active and the first logic potential or according to the potential of the precharging control signal, the potential of the sensing activation control signal SE_Active and the second logic potential, and output the first activation potential or the first non-activation potential to the first voltage comparator 182 via the output terminal SE (e.g., the output terminal SEL[0]). Similarly, the second logic combination circuit (see FIG. 6) includes a second NAND gate A1 and a second AND gate A2. The second NAND gate A1 is configured to receive the second discharging potential (e.g., low potential) or the second precharging potential (e.g., high potential) via a first input terminal BL, receive the third discharging potential (e.g., high potential) via a second input terminal VREF, and output a third logic potential (e.g., high potential) or a fourth logic potential (e.g., low potential) according to the second discharging potential and the third discharging potential or according to the second precharging potential and the third discharging potential. The second AND gate A2 is configured to receive the third logic potential (e.g., high potential) or the fourth logic potential (e.g., low potential) from the second NAND gate A1 and receive a potential of the precharging control signal PRCH and a potential of the sensing activation control signal SE_Active from the control circuit 20, and the second AND gate A2 is further configured to generate the second activation potential or the second non-activation potential according to the potential of the precharging control signal, the potential of the sensing activation control signal SE_Active and the third logic potential or according to the potential of the precharging control signal, the potential of the sensing activation control signal SE_Active and the fourth logic potential, and output the second activation potential or the second non-activation potential to the second voltage comparator 182 via the output terminal SE (e.g., the output terminal SER[0]).

The present disclosure provides two reading modes, each of which will be described below.

First Reading Mode: Reading Two Bits of Data in Sequence

In the first reading mode, the two bits "00", "01", "10" or "11" stored in the memory cell 13 can be read out in sequence by the reading circuit 18.

In the present embodiment, the first reading mode of the present disclosure will be described with an example that the two bits "10" stored in the memory cell 13 are read out in sequence by the reading circuit 18.

Figure 10:
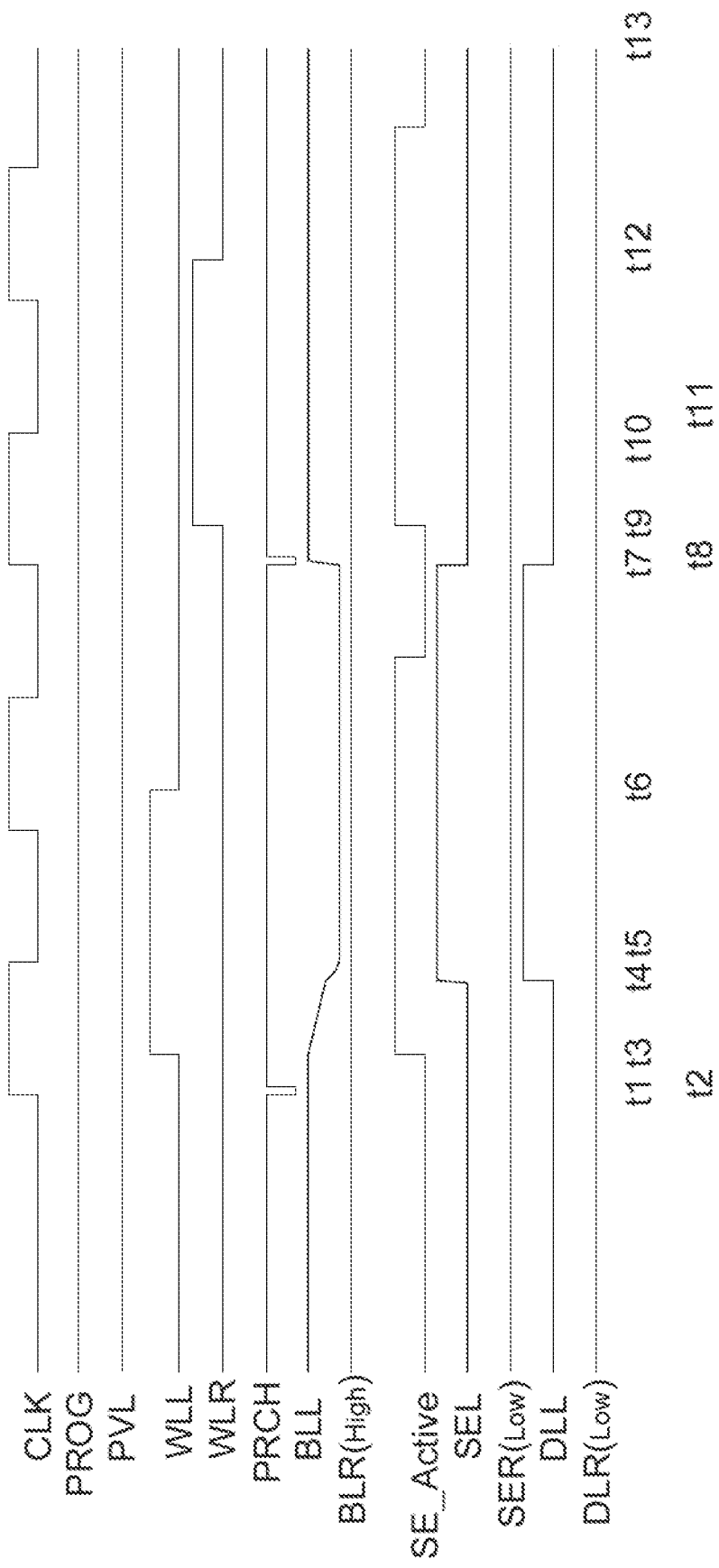
FIG. 10 is a signal timing diagram of an MSOTP memory circuit in a first reading mode according to one embodiment of the present disclosure.

FIG. 10 is a signal timing diagram of an MSOTP memory circuit 10 in a first reading mode according to one embodiment of the present disclosure. Referring to FIG. 1, FIG. 5, and FIG. 10, when the memory cell 13 is in a first reading state, the first reading mode of the present embodiment will be adopted and described below.

Time t1~t2: The control circuit 20 outputs the programming control signal PROG (e.g., low potential) and the precharging control signal PRCH (e.g., low potential) to the bit line decoding and precharging integration circuit 14, such that the bit line decoding and precharging integration circuit 14 outputs a first precharging potential (e.g., high potential) via the first bit line BLL according to a second logic potential combination of the programming control signal PROG (e.g., low potential) and the precharging control signal PRCH (e.g., low potential). After the bit line decoding and precharging integration circuit 14 outputs the first precharging potential (e.g., high potential), the control circuit 20 switches the precharging control signal PRCH (e.g., low potential) to another potential (e.g., high potential) to make the first bit line BLL stay in a first floating state. In addition, the gate 32 of the MOS storage transistor 30 receives the reading control potential (e.g., low potential) from the programming voltage driving circuit 16.

Time t2 to t3: A first buffer time.

Time t3 to t4: The control circuit 20 outputs the sensing activation control signal SE_Active (e.g., high potential) to the reading circuit 18 and outputs the first gate control potential (e.g., high potential), such that the first word line WLL receives the first gate control potential (e.g., high potential). In the meantime, the first bit line is in the first floating state for a first predetermined discharging time, and the sensing circuit 18 begins to detect whether the first precharging potential (e.g., high potential) on the first bit line BLL is discharged to the first discharging potential (e.g., low potential).

Time t4 to t5: The sensing circuit 18 detects that the first precharging potential (e.g., high potential) on the first bit line BLL is discharged to the first discharging potential (e.g., low potential) and outputs a first activation potential (e.g., high potential) to the first voltage comparator 182 via the activation output terminal SEL (e.g., SEL[0]). In the meantime, the first voltage comparator 182 receives the first discharging potential from the first bit line BLL staying in the first floating state, receives the third discharging potential from the reference voltage line P1, compares the first discharging potential with the third discharging potential, and finally outputs a first data bit (e.g., 1) via a first data output terminal DLL (e.g., DLL[0]) according to a first comparison result.

Time t5 to t6: A second buffer time.

Time t6 to t7: The first data bit (e.g., 1) is read out.

Time t7~t8: The control circuit 20 outputs the programming control signal PROG (e.g., low potential) and the precharging control signal PRCH (e.g., low potential) to the bit line decoding and precharging integration circuit 14, such that the bit line decoding and precharging integration circuit 14 outputs a second precharging potential (e.g., high potential) via the second bit line BLR according to a second logic potential combination of the programming control signal PROG (e.g., low potential) and the precharging control signal PRCH (e.g., low potential). After the bit line decoding and precharging integration circuit 14 outputs the second precharging potential (e.g., high potential), the control circuit 20 switches the precharging control signal PRCH (e.g., low potential) to another potential (e.g., high potential) to make the second bit line BLR stay in a second floating state.

Time t8 to t9: A third buffer time.

Time t9 to t10: The control circuit 20 outputs the sensing activation control signal SE_Active (e.g., high potential) to the reading circuit 18 and outputs the third gate control potential (e.g., high potential), such that the second word line WLR receives the third gate control potential (e.g., high potential). In the meantime, the second bit line is in the second floating state for a second predetermined discharging time, and the sensing circuit 18 begins to detect whether the second precharging potential (e.g., high potential) on the second bit line BLR is discharged to the second discharging potential (e.g., low potential).

Time t10 to t11: The sensing circuit 18 detects that the second precharging potential (e.g., high potential) on the second bit line BLR is not discharged to the second discharging potential (e.g., low potential) and thus outputs a first non-activation potential (e.g., low potential) to the second voltage comparator 182 via the activation output terminal SER (e.g., SER[0]). In the meantime, the second voltage comparator 182 is not activated and outputs a second data bit (e.g., 0) via a second data output terminal DLR (e.g., DLR[0]).

Time t11 to t12: A fourth buffer time.

Time t12 to t13: The second data bit (e.g., 0) is read out.

Second Reading Mode: Reading Two Bits of Data at the Same Time

In the second reading mode, the two bits "00", "01", "10" or "11" stored in the memory cell 13 can be read out at the same time by the reading circuit 18.

In the present embodiment, the second reading mode of the present disclosure will be described with an example that the two bits "10" stored in the memory cell 13 are read out at the same time by the reading circuit 18.

Figure 11:
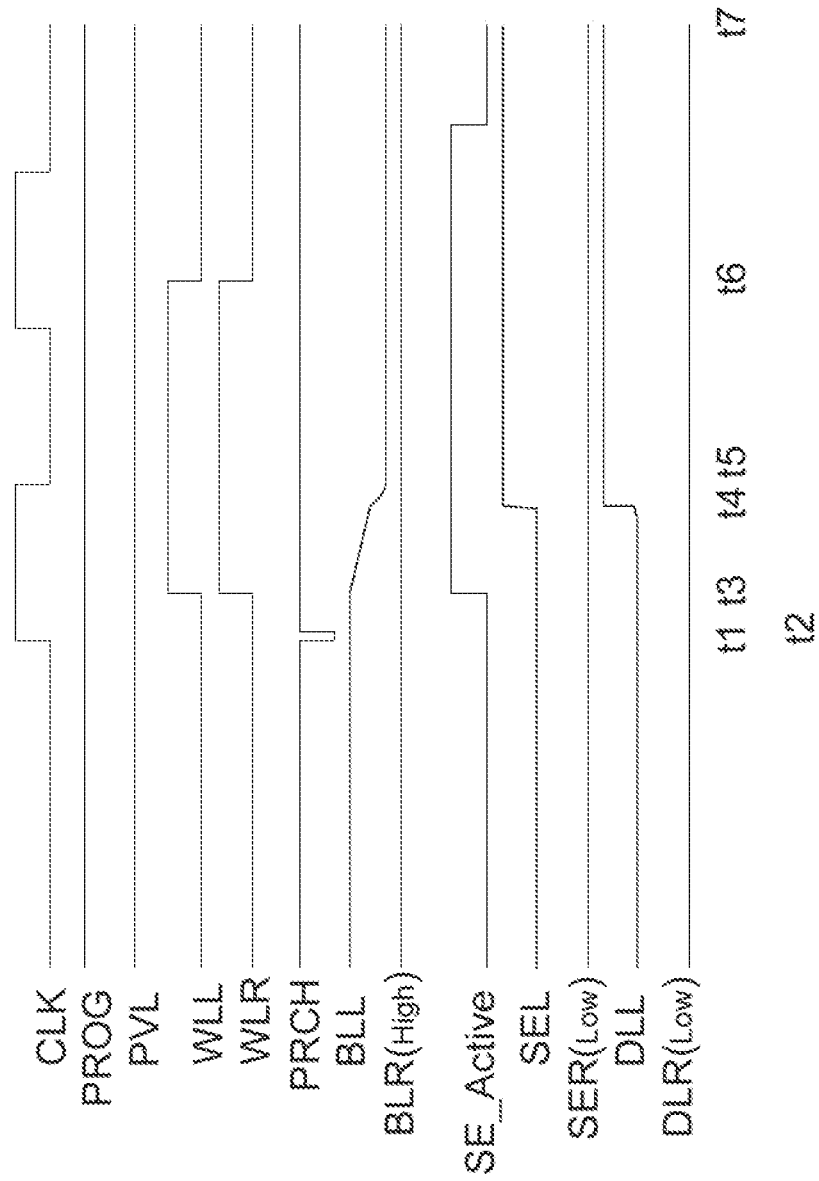
FIG. 11 is a signal timing diagram of an MSOTP memory circuit in a second reading mode according to one embodiment of the present disclosure.

FIG. 11 is a signal timing diagram of an MSOTP memory circuit 10 in a second reading mode according to one embodiment of the present disclosure. Referring to FIG. 1, FIG. 5, and FIG. 11, when the memory cell 13 is in a second reading state, the second reading mode of the present embodiment will be adopted and described below.

Time t1~t2: The control circuit 20 outputs the programming control signal PROG (e.g., low potential) and the precharging control signal PRCH (e.g., low potential) to the bit line decoding and precharging integration circuit 14, such that the bit line decoding and precharging integration circuit 14 outputs a first precharging potential (e.g., high potential) via the first bit line BLL and output a second precharging potential (e.g., high potential) via the second bit line BLR according to a second logic potential combination of the programming control signal PROG (e.g., low potential) and the precharging control signal PRCH (e.g., low potential). After the bit line decoding and precharging integration circuit 14 outputs the first precharging potential (e.g., high potential) and the second precharging potential (e.g., high potential), the control circuit 20 switches the precharging control signal PRCH (e.g., low potential) to another potential (e.g., high potential) to make the first bit line BLL stay in a first floating state and the second bit line BLR stay in a second floating state. In addition, the gate 32 of the MOS storage transistor 30 receives the reading control potential (e.g., low potential) from the programming voltage driving circuit 16.

Time t2 to t3: A first buffer time.

Time t3 to t4: The control circuit 20 outputs the sensing activation control signal SE_Active (e.g., high potential) to the reading circuit 18 and outputs the first gate control potential (e.g., high potential) and the third gate control potential (e.g., high potential), respectively, such that the first word line WLL receives the first gate control potential (e.g., high potential) and the second word line WLR receives the third gate control potential (e.g., high potential). In the meantime, the first bit line is in the first floating state for a first predetermined discharging time, and the second bit line is in the second floating state for a second predetermined discharging time. The sensing circuit 18 begins to detect whether the first precharging potential (e.g., high potential) on the first bit line BLL is discharged to the first discharging potential (e.g., low potential) and detect whether the second precharging potential (e.g., high potential) on the second bit line BLR is discharged to the second discharging potential (e.g., low potential).

Time t4 to t5: The sensing circuit 18 detects that the first precharging potential (e.g., high potential) on the first bit line BLL is discharged to the first discharging potential (e.g., low potential) and outputs a first activation potential (e.g., high potential) to the first voltage comparator 182 via the activation output terminal SEL (e.g., SEL[0]). In addition, the sensing circuit 18 detects that the second precharging potential (e.g., high potential) on the second bit line BLR is not discharged to the second discharging potential (e.g., low potential) and thus outputs a first non-activation potential (e.g., low potential) to the second voltage comparator 182 via the activation output terminal SER (e.g., SER[0]). In the meantime, the first voltage comparator 182 receives the first discharging potential from the first bit line BLL staying in the first floating state, receives the third discharging potential from the reference voltage line P1, compares the first discharging potential with the third discharging potential, and finally outputs a first data bit (e.g., 1) via a first data output terminal DLL (e.g., DLL[0]) according to a first comparison result. In addition, the second voltage comparator 182 is not activated and outputs a second data bit (e.g., 0) via a second data output terminal DLR (e.g., DLR[0]).

Time t5 to t6: A second buffer time.

Time t6 to t7: The first data bit (e.g., 1) and the second data bit (e.g., 0) are read out.

Figure 12:
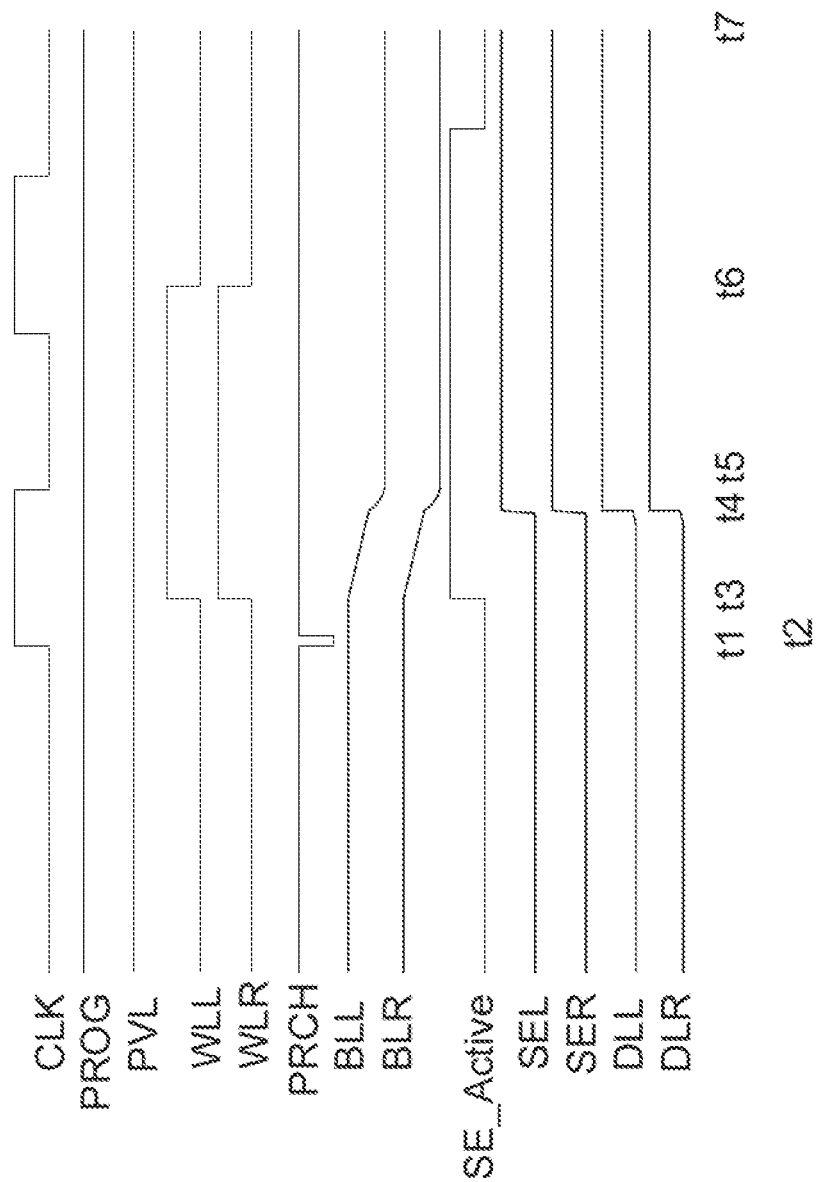
FIG. 12 is a signal timing diagram of an MSOTP memory circuit in a second reading mode according to another embodiment of the present disclosure.

Similarly, the two bits "00", "01" or "11" stored in the memory cell 13 can also be read out with the second reading mode, which is not described in detail herein. For example, the two bits "11" stored in the memory cell 13 can also be read out with the second reading mode as shown in FIG. 12.

Although the present invention has been disclosed in the foregoing preferred embodiments, they are not intended to limit the present disclosure. Therefore, the protection scope of the present invention shall be subject to the protection scope of the claims.

What is claimed is:

1. A multi-state one-time programmable (MSOTP) memory circuit comprising:
   a first bit line and a second bit line;
   a first word line and a second word line;
   a memory cell including:
      a metal oxide semiconductor field effect (MOS) storage transistor having a gate, a first electrode and a second electrode, wherein a first non-breakdown state or a first breakdown state exists between the gate and the first electrode of MOS storage transistor, and a second non-breakdown state or a second breakdown state exists between the gate and the second electrode of MOS storage transistor;

a first metal oxide semiconductor field effect (MOS) access transistor having a first gate, a first electrode and a second electrode, wherein the first gate is electrically connected to the first word line, the first electrode of the first MOS access transistor is electrically connected to the first bit line, and the second electrode of the first MOS access transistor is electrically connected to the first electrode of the MOS storage transistor; and a second metal oxide semiconductor field effect (MOS) access transistor having a second gate, a first electrode and a second electrode, wherein the second gate is electrically connected to the second word line, the first electrode of the second MOS access transistor is electrically connected to the second electrode of the MOS storage transistor, and the second electrode of the second MOS access transistor is electrically connected to the second bit line; and a programming voltage driving circuit electrically connected to the gate of the MOS storage transistor and configured to selectively output one of a writing control potential and a reading control potential, wherein:

the programming voltage driving circuit outputs the writing control potential to the gate of the MOS storage transistor when the memory cell is in a first writing state; and the programming voltage driving circuit outputs the reading control potential to the gate of the MOS storage transistor when the memory cell is in a reading state.

2. The MSOTP memory circuit of claim 1, wherein the programming voltage driving circuit further includes:

a charge pump circuit having a voltage input terminal and a voltage output terminal electrically connected to the gate of the MOS storage transistor, wherein the charge pump circuit is configured to receive a direct current (DC) voltage from the voltage input terminal, boost the DC voltage to generate the writing control potential, and output one of the writing control potential and the reading control potential to the gate of the MOS storage transistor via the voltage output terminal; and a power switch electrically connected to the voltage output terminal of the charge pump circuit and configured to receive a switching signal and control the charge pump circuit to output one of the writing control potential and the reading control potential to the gate of the MOS storage transistor according to the switching signal.

3. The MSOTP memory circuit of claim 2, wherein:

the switching signal includes a first switching potential and a second switching potential;

when the memory cell is in the first writing state, the power switch controls the charge pump circuit to output the writing control potential to the gate of the MOS storage transistor according to the first switching potential, and when the memory cell is in the reading state, the power switch changes the writing control potential to the reading control potential according to the second switching potential, so as to control the charge pump circuit to output the reading control potential to the gate of the MOS storage transistor.

4. The MSOTP memory circuit of claim 1, further comprising:

a control circuit electrically connected to the first word line and the second word line and configured to output a first gate control signal to the first gate of the first MOS access transistor via the first word line and output a second gate control signal to the second gate of the second MOS access transistor via the second word line, wherein the control circuit is further configured to output a programming control signal and a precharging control signal; and a bit line decoding and precharging integration circuit electrically connected to the control circuit and configured to receive the programming control signal and the precharging control signal from the control circuit, wherein the bit line decoding and precharging integration circuit is further electrically connected to the first bit line and the second bit line and further configured to:

output a first electrode control signal to the first electrode of the first MOS access transistor via the first bit line and a second electrode control signal to the second electrode of the second MOS access transistor via the second bit line according to a first logic potential combination of the programming control signal and the precharging control signal when the memory cell is in the first writing state;

output a first precharging potential via the first bit line and a second precharging potential via the second bit line according to a second logic potential combination of the programming control signal and the precharging control signal when the memory cell is in a precharging state; and make the first bit line stay in a first floating state and the second bit line stay in a second floating state according to a third logic potential combination of the programming control signal and the precharging control signal when the memory cell is in the reading state.

5. The MSOTP memory circuit of claim 4, wherein:

the first gate control signal includes a first gate control potential and a second gate control potential, and the first gate control potential and the second gate control potential are opposite to each other in phase;

the second gate control signal includes a third gate control potential and a fourth gate control potential, and the third gate control potential and the fourth gate control potential are opposite to each other in phase;

the first electrode control signal includes a first electrode control potential and a second electrode control potential, and the first electrode control potential and the second electrode control potential are opposite to each other in phase;

the second electrode control signal includes a third electrode control potential and a fourth electrode control potential, and the third electrode control potential and the fourth electrode control potential are opposite to each other in phase; and the control circuit is further configured to output a masking control signal, and the bit line decoding and precharging integration circuit is further configured to receive the masking control signal from the control circuit, wherein the masking control signal includes a first masking control potential and a second masking control potential, and the first masking control potential and the second masking control potential are opposite to each other in phase.

6. The MSOTP memory circuit of claim 5, wherein:
when the memory cell is in the first writing state, the control circuit outputs the first gate control potential to the first gate of the first MOS access transistor via the first word line and outputs the third gate control potential to the second gate of the second MOS access transistor via the second word line;
when the memory cell is in the first writing state, the bit line decoding and precharging integration circuit outputs the second electrode control potential to the first electrode of the first MOS access transistor via the first bit line and outputs the third electrode control potential to the second electrode of the second MOS access transistor via the second bit line according to the first logic potential combination and the first masking control potential, such that the first breakdown state is formed between the gate and the first electrode in the MOS storage transistor and such that the second non-breakdown state exists between the gate and the second electrode in the MOS storage transistor; and
the first gate control potential and the third gate control potential are substantially equal, and the second electrode control potential and the third electrode control potential are opposite to each other in phase.

7. The MSOTP memory circuit of claim 6, wherein:
after the first breakdown state is formed between the gate and the first electrode in the MOS storage transistor, the bit line decoding and precharging integration circuit outputs the first electrode control potential to the first electrode of the first MOS access transistor via the first bit line and outputs the fourth electrode control potential to the second electrode of the second MOS access transistor via the second bit line according to the first logic potential combination and the second masking control potential, such that the second non-breakdown state between the gate and the second electrode in the MOS storage transistor is changed to the second breakdown state; and
the first electrode control potential and the fourth electrode control potential are opposite to each other in phase.

8. The MSOTP memory circuit of claim 5, wherein:
when the memory cell is in the first writing state, the control circuit outputs the first gate control potential to the first gate of the first MOS access transistor via the first word line and outputs the third gate control potential to the second gate of the second MOS access transistor via the second word line;
when the memory cell is in the first writing state, the bit line decoding and precharging integration circuit outputs the first electrode control potential to the first electrode of the first MOS access transistor via the first bit line and outputs the fourth electrode control potential to the second electrode of the second MOS access transistor via the second bit line according to the first logic potential combination and the second masking control potential, such that the first non-breakdown state exists between the gate and the first electrode in the MOS storage transistor and such that the second breakdown state is formed between the gate and the second electrode in the MOS storage transistor; and
the first gate control potential and the third gate control potential are substantially equal, and the first electrode control potential and the fourth electrode control potential are opposite to each other in phase.

9. The MSOTP memory circuit of claim 8, wherein:
after the second breakdown state is formed between the gate and the second electrode in the MOS storage transistor, the bit line decoding and precharging integration circuit outputs the second electrode control potential to the first electrode of the first MOS access transistor via the first bit line and outputs the third electrode control potential to the second electrode of the second MOS access transistor via the second bit line according to the first logic potential combination and the first masking control potential, such that the first non-breakdown state between the gate and the first electrode in the MOS storage transistor is changed to the first breakdown state; and
the second electrode control potential and the third electrode control potential are opposite to each other in phase.

10. The MSOTP memory circuit of claim 5, wherein:
when the memory cell is in a second writing state, the bit line decoding and precharging integration circuit outputs the second electrode control potential to the first electrode of the first MOS access transistor via the first bit line and outputs the fourth electrode control potential to the second electrode of the second MOS access transistor via the second bit line according to the first masking control potential and a fourth logic potential combination of the programming control signal and the precharging control signal;
when the memory cell is in the second writing state, the control circuit outputs the first gate control potential to the first gate of the first MOS access transistor via the first word line and outputs the fourth gate control potential to the second gate of the second MOS access transistor via the second word line, such that the first breakdown state is formed between the gate and the first electrode in the MOS storage transistor and such that the second non-breakdown state exists between the gate and the second electrode in the MOS storage transistor; and
the second electrode control potential and the fourth electrode control potential are substantially equal, and the first gate control potential and the fourth gate control potential are opposite to each other in phase.

11. The MSOTP memory circuit of claim 10, wherein:
after the first breakdown state is formed between the gate and the first electrode in the MOS storage transistor, the control circuit outputs the second gate control potential to the first gate of the first MOS access transistor via the first word line and outputs the third gate control potential to the second gate of the second MOS access transistor via the second word line, such that the second non-breakdown state between the gate and the second electrode in the MOS storage transistor is changed to the second breakdown state; and
the second gate control potential and the third gate control potential are opposite to each other in phase.

12. The MSOTP memory circuit of claim 5, wherein:
when the memory cell is in a second writing state, the bit line decoding and precharging integration circuit outputs the second electrode control potential to the first electrode of the first MOS access transistor via the first bit line and outputs the fourth electrode control potential to the second electrode of the second MOS access transistor via the second bit line according to the first masking control potential and a fourth logic potential combination of the programming control signal and the precharging control signal;

when the memory cell is in the second writing state, the control circuit outputs the second gate control potential to the first gate of the first MOS access transistor via the first word line and outputs the third gate control potential to the second gate of the second MOS access transistor via the second word line, such that the first non-breakdown state exists between the gate and the first electrode in the MOS storage transistor and such that the second breakdown state is formed between the gate and the second electrode in the MOS storage transistor; and the second electrode control potential and the fourth electrode control potential are substantially equal, and the second gate control potential and the third gate control potential are opposite to each other in phase.

13. The MSOTP memory circuit of claim 12, wherein:

after the second breakdown state is formed between the gate and the second electrode in the MOS storage transistor, the control circuit outputs the first gate control potential to the first gate of the first MOS access transistor via the first word line and outputs the fourth gate control potential to the second gate of the second MOS access transistor via the second word line, such that the first non-breakdown state between the gate and the first electrode in the MOS storage transistor is changed to the first breakdown state; and the first gate control potential and the fourth gate control potential are opposite to each other in phase.

14. The MSOTP memory circuit of claim 5, wherein:

when the memory cell is in a third writing state, the control circuit outputs the first gate control potential to the first gate of the first MOS access transistor via the first word line and outputs the third gate control potential to the second gate of the second MOS access transistor via the second word line;

when the memory cell is in the third writing state, the bit line decoding and precharging integration circuit outputs the second electrode control potential to the first electrode of the first MOS access transistor via the first bit line and outputs the fourth electrode control potential to the second electrode of the second MOS access transistor via the second bit line according to the first masking control potential and a fourth logic potential combination of the programming control signal and the precharging control signal, such that the first breakdown state is formed between the gate and the first electrode in the MOS storage transistor and the second breakdown state is formed between the gate and the second electrode in the MOS storage transistor at the same time; and the second electrode control potential and the fourth electrode control potential are substantially equal.

15. The MSOTP memory circuit of claim 5, wherein:

when the memory cell is in a fourth writing state, the control circuit outputs the first gate control potential to the first gate of the first MOS access transistor via the first word line and outputs the third gate control potential to the second gate of the second MOS access transistor via the second word line;

when the memory cell is in the fourth writing state, the bit line decoding and precharging integration circuit outputs the first electrode control potential to the first electrode of the first MOS access transistor via the first bit line and outputs the third electrode control potential to the second electrode of the second MOS access transistor via the second bit line according to the second masking control potential and a fourth logic potential combination of the programming control signal and the precharging control signal, such that the first non-breakdown state exists between the gate and the first electrode in the MOS storage transistor and the second non-breakdown state exists between the gate and the second electrode in the MOS storage transistor at the same time; and the first electrode control potential and the third electrode control potential are substantially equal.

16. The MSOTP memory circuit of claim 5, wherein:

when the memory cell is in the precharging state, the bit line decoding and precharging integration circuit outputs the first precharging potential to the first electrode of the first MOS access transistor via the first bit line and outputs the second precharging potential to the second electrode of the second MOS access transistor via the second bit line according to the second logic potential combination, wherein the first precharging potential and the second precharging potential are equal; and after the bit line decoding and precharging integration circuit outputs the first precharging potential and the second precharging potential, the bit line decoding and precharging integration circuit makes the first bit line stay in the first floating state and the second bit line stay in the second floating state according to the third logic potential combination.

17. The MSOTP memory circuit of claim 16, wherein:

when the first non-breakdown state exists between the gate and the first electrode of the MOS storage transistor, the first precharging potential is maintained on the first bit line staying in the first floating state;

when the first breakdown state exists between the gate and the first electrode of the MOS storage transistor, the first precharging potential on the first bit line staying in the first floating state is discharged to a first discharging potential;

when the second non-breakdown state exists between the gate and the second electrode of the MOS storage transistor, the second precharging potential is maintained on the second bit line staying in the second floating state; or when the second breakdown state exists between the gate and the second electrode of the MOS storage transistor, the second precharging potential on the second bit line staying in the second floating state is discharged to a second discharging potential.

18. The MSOTP memory circuit of claim 17, further comprising a reading circuit electrically connected to the control circuit, and the reading circuit including:

a reference voltage;

a switching element;

a reference voltage line selectively electrically connected to the reference voltage or electrically disconnected from the reference voltage via the switching element, wherein:

when the memory cell is in the precharging state, the switching element is switched from an off state to a conducting state, such that the reference voltage provides a reference potential on the reference voltage line, and after the reference voltage provides the reference potential on the reference voltage line, the switching element is switched from the conducting state to the off state, such that the reference voltage line is electrically disconnected from the reference voltage, so as to cause the reference potential on the reference voltage line to be discharged to a third discharging potential;

a first voltage comparator having two input terminals and an output terminal, wherein one of the two input terminals is electrically connected to the first bit line and another one of the two input terminals is electrically connected to the reference voltage line and wherein the first voltage comparator receives the first precharging potential or the first discharging potential from the first bit line staying in the first floating state via one of the two input terminals and receives the third discharging potential from the reference voltage line via the other of the two input terminals;

a second voltage comparator having two input terminals and an output terminal, wherein one of the two input terminals of the second voltage comparator is electrically connected to the second bit line and another one of the two input terminals of the second voltage comparator is electrically connected to the reference voltage line, and wherein the second voltage comparator receives the second precharging potential or the second discharging potential from the second bit line staying in the second floating state via one of the two input terminals of the second voltage comparator and receives the third discharging potential from the reference voltage line via another one of the two input terminals of the second voltage comparator; and a sensing circuit electrically connected to the reference voltage line, the first bit line and the second bit line, wherein:

when the memory cell is in the reading state, the sensing circuit receives the first precharging potential or the first discharging potential from the first bit line staying in the first floating state, receives the second precharging potential or the second discharging potential from the second bit line staying in the second floating state, and receives the third discharging potential from the reference voltage line;

when the sensing circuit receives the first discharging potential from the first bit line staying in the first floating state, the sensing circuit outputs a first activation potential to the first voltage comparator according to the first discharging potential and the third discharging potential, wherein the first discharging potential and the third discharging potential are opposite to each other in phase;

when the sensing circuit receives the first precharging potential from the first bit line staying in the first floating state, the sensing circuit outputs a first non-activation potential to the first voltage comparator according to the first precharging potential and the third discharging potential, wherein the first precharging potential and the third discharging potential are in the same phase;

when the sensing circuit receives the second discharging potential from the second bit line staying in the second floating state, the sensing circuit outputs a second activation potential to the second voltage comparator according to the second discharging potential and the third discharging potential, wherein the second discharging potential and the third discharging potential are opposite to each other in phase; and when the sensing circuit receives the second precharging potential from the second bit line staying in the second floating state, the sensing circuit outputs a second non-activation potential to the second voltage comparator according to the second precharging potential and the third discharging potential, wherein the second precharging potential and the third discharging potential are in the same phase.

19. The MSOTP memory circuit of claim 18, wherein:

when that first voltage comparator receives the first activation potential, the first voltage comparator is activated to compare the first discharging potential with the third discharging potential and output a first data bit according to a first comparison result;

when the first voltage comparator receives the first non-activation potential, the first voltage comparator is not activated and outputs a second data bit, wherein the first data bit and the second data bit are opposite to each other in phase;

when that second voltage comparator receives the second activation potential, the second voltage comparator is activated to compare the second discharging potential with the third discharging potential and output a third data bit according to a second comparison result; and when the second voltage comparator receives the second non-activation potential, the second voltage comparator is not activated and outputs a fourth data bit, wherein the third data bit and the fourth data bit are opposite to each other in phase.

20. The MSOTP memory circuit of claim 19, wherein:

the sensing circuit includes a first NAND gate, a first AND gate, a second NAND gate and a second AND gate;

the first NAND gate is configured to receive the first discharging potential and the third discharging potential or the first precharging potential and the third discharging potential and output a first logic potential or a second logic potential according to the first discharging potential and the third discharging potential or according to the first precharging potential and the third discharging potential;

the first AND gate is configured to receive the first logic potential or the second logic potential from the first NAND gate and receive a potential of the precharging control signal from the control circuit, and the first AND gate is further configured to generate the first activation potential or the first non-activation potential according to the potential of the precharging control signal and the first logic potential or according to the potential of the precharging control signal and the second logic potential;

the second NAND gate is configured to receive the second discharging potential and the third discharging potential or the second precharging potential and the third discharging potential and output a third logic potential or a fourth logic potential according to the second discharging potential and the third discharging potential or according to the second precharging potential and the third discharging potential; and the second AND gate is configured to receive the third logic potential or the fourth logic potential from the second NAND gate and receive the potential of the precharging control signal from the control circuit, and the second AND gate is further configured to generate the second activation potential and the second non-activation potential according to the potential of the precharging control signal and the third logic potential or according to the potential of the precharging control signal and the fourth logic potential.

21. The MSOTP memory circuit of claim 19, wherein:
when the memory cell is in the reading state, the first word line receives the first gate control potential, the gate of the MOS storage transistor receives the reading control potential from the programming voltage driving circuit, and the first bit line is in the first floating state for a first predetermined discharging time, such that the first voltage comparator receives the first precharging potential or the first discharging potential from the first bit line staying in the first floating state and outputs the first data bit or the second data bit;

when the first voltage comparator outputs the first data bit or the second data bit, the second word line receives the third gate control potential, and the second bit line is in the second floating state for a second predetermined discharging time, such that the second voltage comparator receives the second precharging potential or the second discharging potential from the second bit line staying in the second floating state and outputs the third data bit or the fourth data bit; and the first gate control potential and the third gate control potential are substantially equal.

22. The MSOTP memory circuit of claim 19, wherein:
when the memory cell is in the reading state, the first word line receives the first gate control potential and the second word line receives the third gate control potential at the same time, the gate of the MOS storage transistor receives the reading control potential from the programming voltage driving circuit, and the first bit line is in the first floating state and the second bit line is in the second floating state for a predetermined discharging time, such that the first voltage comparator receives the first precharging potential or the first discharging potential from the first bit line staying in the first floating state and outputs one of the first data bit and the second data bit and such that the second voltage comparator receives the second precharging potential or the second discharging potential from the second bit line staying in the second floating state and outputs one of the third data bit and the fourth data bit; and the first gate control potential and the third gate control potential are substantially equal.

* * * * *